United States Patent
Chang et al.

(10) Patent No.: US 12,298,672 B2
(45) Date of Patent: May 13, 2025

(54) SEMICONDUCTOR PROCESSING TOOL AND METHODS OF OPERATION

(71) Applicant: Taiwan Semiconductor Manufacturing Company, Ltd., Hsinchu (TW)

(72) Inventors: Kai-Chieh Chang, Changhua (TW); Kai-Fa Ho, New Taipei (TW); Li-Jui Chen, Hsinchu (TW); Heng-Hsin Liu, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/446,870

(22) Filed: Aug. 9, 2023

(65) Prior Publication Data

US 2023/0384688 A1 Nov. 30, 2023

Related U.S. Application Data

(63) Continuation of application No. 17/446,252, filed on Aug. 27, 2021, now Pat. No. 11,809,087.

(60) Provisional application No. 63/201,461, filed on Apr. 30, 2021.

(51) Int. Cl.
  *G03F 7/00* (2006.01)
(52) U.S. Cl.
  CPC ...... *G03F 7/70358* (2013.01); *G03F 7/70433* (2013.01); *G03F 7/70525* (2013.01)

(58) Field of Classification Search
  CPC .......... G03F 7/70525; G03F 7/70425
  See application file for complete search history.

(56) References Cited

U.S. PATENT DOCUMENTS

| | | | |
|---|---|---|---|
| 6,342,942 B1 | 1/2002 | Uzawa | |
| 6,576,919 B1* | 6/2003 | Yoshida | G03F 7/70716 700/121 |
| 11,579,535 B2 | 2/2023 | Anunciado | |
| 2011/0043776 A1* | 2/2011 | Fujisawa | G03F 7/70525 355/53 |
| 2012/0162622 A1 | 6/2012 | Varela et al. | |
| 2014/0065734 A1 | 3/2014 | Bauch | |
| 2015/0082265 A1* | 3/2015 | Huang | H01L 23/528 716/111 |
| 2018/0356736 A1 | 12/2018 | Danilin | |

(Continued)

FOREIGN PATENT DOCUMENTS

| | | |
|---|---|---|
| JP | H09293656 A | 11/1997 |
| JP | 4579367 B2 | 11/2010 |
| JP | 2013207258 A | 10/2013 |

(Continued)

*Primary Examiner* — Steven H Whitesell
(74) *Attorney, Agent, or Firm* — Harrity & Harrity, LLP

(57) ABSTRACT

Some implementations described herein provide an exposure tool and associated methods of operation in which a scanner control system generates a scanner route for an exposure recipe such that the distance traveled by a substrate stage of the exposure tool along the scanner route is reduced and/or optimized for non-exposure fields on a semiconductor substrate. In this way, the scanner control system increases the productivity of the exposure tool, reduces processing times of the exposure tool, and increases yield in a semiconductor fabrication facility in which the exposure tool is included.

20 Claims, 18 Drawing Sheets

(56) References Cited

U.S. PATENT DOCUMENTS

2022/0350259 A1  11/2022  Chang et al.

FOREIGN PATENT DOCUMENTS

| TW | 202024806 A | 7/2020 |
| TW | 202111442 A | 3/2021 |

* cited by examiner

SEMICONDUCTOR PROCESSING TOOL AND METHODS OF OPERATION

CROSS-REFERENCE TO RELATED APPLICATIONS

This Patent Application is a continuation of U.S. patent application Ser. No. 17/446,252, filed Aug. 27, 2021, and entitled "SEMICONDUCTOR PROCESSING TOOL AND METHODS OF OPERATION," which claims priority to U.S. Provisional Patent Application No. 63/201,461, filed on Apr. 30, 2021, and entitled "SEMICONDUCTOR PROCESSING TOOL AND METHODS OF OPERATION." The disclosures of the prior Applications are considered part of and are incorporated by reference into this Patent Application.

BACKGROUND

An exposure tool is a semiconductor processing tool that is capable of exposing a photoresist layer to a radiation source, such as an ultraviolet light (UV) source (e.g., a deep UV light source, an extreme UV (EUV) light source, and/or the like), an x-ray source, an electron beam source, and/or another type of radiation source. An exposure tool may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. An exposure tool includes a scanner, a stepper, or a similar type of exposure tool.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
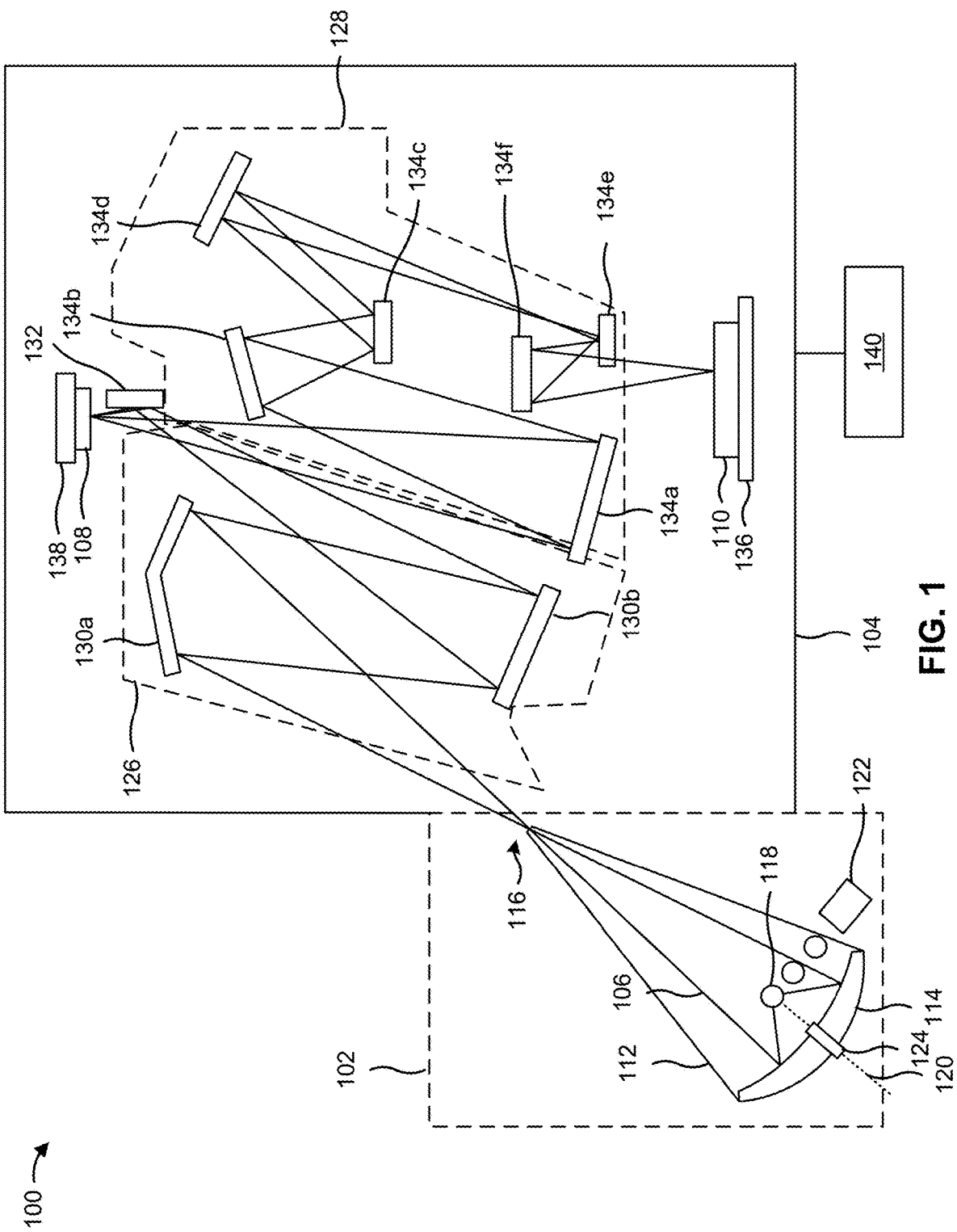
FIG. 1 is a diagram of an example lithography system described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

An exposure tool (e.g., an extreme ultraviolet (EUV) exposure tool, an immersion exposure tool, or another type of exposure tool) exposes a plurality of exposure fields (or die exposure fields) on a semiconductor substrate to build up layers of devices formed on the semiconductor substrate. An exposure tool scans and/or steps from die exposure field to die exposure field based on an exposure recipe that is generated for a layer of the semiconductor substrate. The exposure tool proceeds along a scanner route of the exposure recipe to each die exposure field and exposes the die exposure fields (or a subset thereof) to radiation in an exposure shot. The scanner route is generated to cause the substrate stage to traverse the exposure fields based on a scan-up scan-down (SUSD) configuration included in the exposure recipe.

Some exposure recipes include dummy shots (or non-die exposure fields), which are exposure fields in which no device is formed. These non-die exposure fields are typically included near the edge of the semiconductor substrate, and are used to enhance the contrast and fine-tune the exposure parameters for adjacent die exposure fields that are used for devices formed on the semiconductor substrate.

An exposure recipe may include a plurality of types of layers, which are combined to form the SUSD configuration and scanner route for the exposure recipe. For example, an exposure recipe may include a line layer, which is an exposure layer that includes dummy shots (or non-die exposure fields). As another example, an exposure recipe may include a hole layer, which is an exposure layer in which dummy shots are not used, and the non-die exposure fields are non-exposure fields (fields in which the radiation dosage is zero (0) such that the non-exposure fields are not exposed to radiation). Non-exposure fields may be selected for the final exposure recipe in cases where additional contrast enhancement is not needed.

Even though non-exposure fields are not exposed to radiation, the exposure tool may still treat the non-exposure fields as non-die exposure fields in the scanner route for the exposure recipe. Thus, the substrate stage still travels along the scanner route as if the non-exposure fields were to be exposed, which results in extra stepping and scanning time in an exposure operation. This reduces the efficiency of the exposure tool and increases processing times of the exposure tool, which reduces throughput in a semiconductor fabrication facility in which the exposure tool is included. An example exposure route of approximately 100 exposure shots (e.g., die exposure fields) may include approximately 5% to approximately 10% non-exposure fields), which can increase the processing time of a semiconductor substrate by approximately 3% to approximately 5% or more.

Some implementations described herein provide an exposure tool and associated methods of operation in which a scanner control system generates a scanner route for an exposure recipe such that the distance traveled by a substrate stage of the exposure tool along the scanner route is reduced and/or optimized for non-exposure fields on a semiconductor substrate. In this way, the scanner control system increases the productivity of the exposure tool, reduces processing times of the exposure tool, and increases yield in a semiconductor fabrication facility in which the exposure tool is included. As an example, the techniques described herein may reduce the distance of a scanner route and a time duration of an exposure operation that includes non-exposure fields by approximately 5% or more.

FIG. 1 is a diagram of an example lithography system 100 described herein. The lithography system 100 includes an extreme ultraviolet (EUV) lithography system or another type of lithography system that is configured to transfer a pattern to a semiconductor substrate using mirror-based optics. The lithography system 100 may be configured for use in a semiconductor processing environment such as a semiconductor foundry or a semiconductor fabrication facility.

As shown in FIG. 1, the lithography system 100 includes a radiation source 102 and an exposure tool 104. The radiation source 102 (e.g., an EUV radiation source or another type of radiation source) is configured to generate radiation 106 such as EUV radiation and/or another type of electromagnetic radiation (e.g., light). The exposure tool 104 (e.g., an EUV scanner or another type of exposure tool) is configured to focus the radiation 106 onto a reflective reticle 108 (or a photomask) such that a pattern is transferred from the reticle 108 onto a semiconductor substrate 110 using the radiation 106.

The radiation source 102 includes a vessel 112 and a collector 114 in the vessel 112. The collector 114, includes a curved mirror that is configured to collect the radiation 106 generated by the radiation source 102 and to focus the radiation 106 toward an intermediate focus 116. The radiation 106 is produced from a plasma that is generated from droplets 118 (e.g., tin (Sn) droplets or another type of droplets) being exposed to a laser beam 120. The droplets 118 are provided across the front of the collector 114 by a droplet generator (DG) head 122. The DG head 122 is pressurized to provide a fine and controlled output of the droplets 118.

A laser source, such as a pulse carbon dioxide ($CO_2$) laser, generates the laser beam 120. The laser beam 120 is provided (e.g., by a beam delivery system to a focus lens) such that the laser beam 120 is focused through a window 124 of the collector 114. The laser beam 120 is focused onto the droplets 118 which generates the plasma. The plasma produces a plasma emission, some of which is the radiation 106. The laser beam 120 is pulsed at a timing that is synchronized with the flow of the droplets 118 from the DG head 122.

The exposure tool 104 includes an illuminator 126 and a projection optics box (POB) 128. The illuminator 126 includes a plurality of reflective mirrors that are configured to focus and/or direct the radiation 106 onto the reticle 108 so as to illuminate the pattern on the reticle 108. The plurality of mirrors include, for example, a mirror 130a and a mirror 130b. The mirror 130a includes a field facet mirror (FFM) or another type of mirror that includes a plurality of field facets. The mirror 130b includes a pupil facet mirror (PFM) or another type of mirror that also includes a plurality of pupil facets. The facets of the mirrors 130a and 130b are arranged to focus, polarize, and/or otherwise tune the radiation 106 from the radiation source 102 to increase the uniformity of the radiation 106 and/or to increase particular types of radiation components (e.g., transverse electric (TE) polarized radiation, transverse magnetic (TM) polarized radiation). Another mirror 132 (e.g., a relay mirror) is included to direct radiation 106 from the illuminator 126 onto the reticle 108.

The projection optics box 128 includes a plurality of mirrors that are configured to project the radiation 106 onto the semiconductor substrate 110 after the radiation 106 is modified based on the pattern of the reticle 108. The plurality of reflective mirrors include, for example, mirrors 134a-134f. In some implementations, the mirrors 134a-134f are configured to focus or reduce the radiation 106 into an exposure field, which may include one or more die areas on the semiconductor substrate 110.

The exposure tool 104 includes a substrate stage 136 (e.g., a wafer stage) configured to support the semiconductor substrate 110. Moreover, the substrate stage 136 is configured to move (or step) the semiconductor substrate 110 through a plurality of exposure fields as the radiation 106 transfers the pattern from the reticle 108 onto the semiconductor substrate 110. The exposure tool 104 also includes a reticle stage 138 that is configured to support and/or secure the reticle 108. Moreover, the reticle stage 138 is configured to move or slide the reticle through the radiation 106 such that the reticle 108 is scanned by the radiation 106. In this way, a pattern that is larger than the field or beam of the radiation 106 may be transferred to the semiconductor substrate 110.

In an example exposure operation (e.g., an EUV exposure operation), the DG head 122 provides the stream of the droplets 118 across the front of the collector 114. The laser beam 120 contacts the droplets 118, which causes a plasma to be generated. The plasma emits or produces the radiation 106 (e.g., EUV light). The radiation 106 is collected by the collector 114 and directed out of the vessel 112 and into the exposure tool 104 toward the mirror 130a of the illuminator 126. The mirror 130a reflects the radiation 106 onto the mirror 130b, which reflects the radiation 106 onto the mirror 132 toward the reticle 108. The radiation 106 is modified by the pattern in the reticle 108. In other words, the radiation 106 reflects off of the reticle 108 based on the pattern of the reticle 108. The reticle 108 directs the radiation 106 toward the mirror 134a in the projection optics box 128, which reflects the radiation 106 onto the mirror 134b. The radiation 106 continues to be reflected and reduced in the projection optics box 128 by the mirrors 134c-134f. The mirror 134f reflects the radiation 106 onto the semiconductor substrate 110 such that the pattern of the reticle 108 is transferred to the semiconductor substrate 110. The above-described exposure operation is an example, and the lithography system 100 may operate according to other EUV techniques and radiation paths that include a greater quantity of mirrors, a lesser quantity of mirrors, and/or a different configuration of mirrors.

As further shown in FIG. 1, the lithography system 100 includes a scanner control system 140. The scanner control system 140 may be included as part of the exposure tool 104, may be included in another subsystem of the lithography system 100, or may include a standalone control system that communicates with the lithography system 100 and/or the subsystems included therein. The scanner control system 140 may control various operational aspects of the exposure tool 104, which may include controlling the operation of the reticle stage 138, controlling the operation of the substrate stage 136, generating exposure recipes for transferring a pattern from the reticle 108 to the semiconductor substrate 110 (or to a semiconductor substrate lot that includes a plurality of semiconductor substrates 110), generating exposure field maps, generating scanner routes (e.g., for the substrate stage 136 to follow in an exposure operation), and/or one or more other techniques and operations described herein.

As indicated above, FIG. 1 is provided as an example. Other examples may differ from what is described with regard to FIG. 1.

Figure 2:
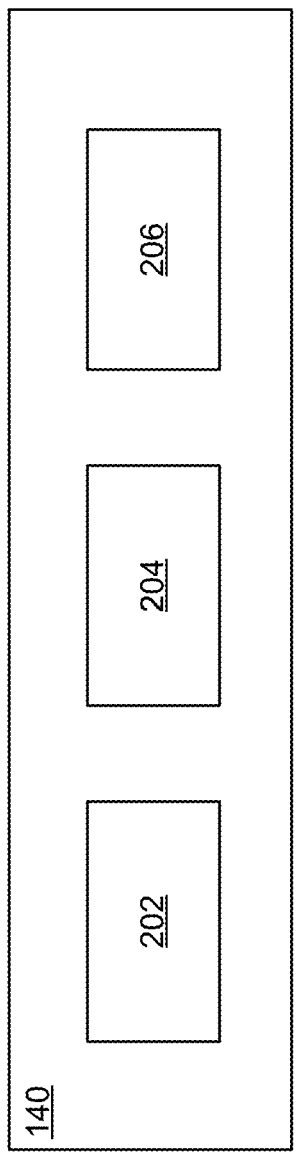
FIG. 2 is a diagram of an example scanner control system described herein for use in the lithography system of FIG. 1.

FIG. 2 is a diagram of an example scanner control system 140 described herein for use in the lithography system 100 of FIG. 1. The scanner control system 140 includes one or more components that are configured to control various operational aspects of the exposure tool 104, the substrate stage 136, and/or the reticle stage 138. As shown in FIG. 2, the scanner control system 140 includes a scanner controller 202, a recipe generator 204, and a layer generator 206, among other components. The components 202-206 include computing devices such as processors, computing systems (e.g., a desktop computer or a server computer), and/or other types of computing devices. In some implementations, one or more of the components 202-206 include or are included in a device, such as a device described in connection with FIG. 6.

The scanner controller 202 is configured to provide signals to the exposure tool 104, the substrate stage 136, and/or the reticle stage 138. The signals may include a voltage, a current, a digital communication, and/or another type of electrical/electronic signal. The scanner controller 202 provides the signals to cause the exposure tool 104, the substrate stage 136, and/or the reticle stage 138 to perform one or more actions associated with an exposure operation in which one or more semiconductor substrates 110 are exposed to the radiation 106. For example, the scanner controller 202 may provide a signal to cause a reticle 108 to be secured to the reticle stage 138, to cause a reticle 108 to be removed from the reticle stage 138, and/or to cause a reticle 108 to be transferred out of the exposure tool 104. As another example, the scanner controller 202 may provide a signal to cause a semiconductor substrate 110 to be placed on the substrate stage 136, to be removed from the substrate stage 136, and/or to be transferred out of the exposure tool 104.

Moreover, the scanner controller 202 is configured to provide one or more signals to control the movement of the substrate stage 136. For example, the scanner controller 202 may provide a signal to cause the substrate stage 136 to step a semiconductor substrate 110 through a plurality of die exposure fields on the semiconductor substrate 110 such that each of the die exposure fields is exposed to the radiation 106 to transfer a pattern from the reticle 108 to the die exposure fields. The scanner controller 202 may cause the substrate stage 136 to step through the plurality of die exposure fields based on an exposure recipe for an exposure operation for the semiconductor substrate 110.

The recipe generator 204 is configured to generate exposure recipes, to provide the exposure recipes to the scanner controller 202, and/or to store exposure recipes (e.g., such that the exposure recipes may be obtained by the scanner controller 202), among other examples. An exposure recipe may include information identifying an exposure field map, a scanner route, and a scan-up scan-down (SUSD) configuration, among other types of information. The recipe generator 204 may generate an exposure recipe for each layer (or exposure operation) for a semiconductor substrate 110 or a semiconductor substrate lot. In some implementations, the recipe generator 204 generates a plurality of exposure recipes for a layer of a semiconductor substrate 110 such that a double patterning technique may be performed for the semiconductor substrate 110.

An exposure field map includes information identifying a respective field type for each field of a semiconductor substrate 110. As an example, a semiconductor substrate 110 may be partitioned into a plurality of fields (e.g., 100 fields or another quantity of fields), and the exposure field map may identify a field type for each of the plurality of fields. Examples of field types include die exposure fields, non-die exposure fields, and non-exposure fields, among other examples. In some implementations, the recipe generator 204 generates an exposure recipe based on a plurality of exposure field maps generated by the layer generator 206. In these implementations, the exposure field identified in the exposure recipe may be a combination of portions of the plurality of exposure field maps generated by the layer generator 206. The recipe generator 204 may determine which portions of the plurality of exposure field maps to include in the (final) exposure field map for the exposure recipe based on performance parameters for an exposure operation associated with the exposure recipe, based on input from an operator of the lithography system 100, and/or based on one or more other factors.

The layer generator 206 is configured to generate exposure field maps, to provide the exposure field maps to the recipe generator 204, and/or to store exposure field maps (e.g., such that the exposure field maps may be obtained by the recipe generator 204), among other examples. As explained above, an exposure field map includes information identifying a respective field type for each field of a semiconductor substrate 110. The layer generator 206 may further generate a scanner route and an SUSD configuration for an exposure field map. The SUSD configuration identifies directional information about the direction that the substrate stage 136 is to move the semiconductor substrate 110 through one or more fields on the semiconductor substrate 110. The scanner route identifies traversal information about the path that the substrate stage 136 is to move the semiconductor substrate 110 between the one or more fields.

As described in greater detail herein, the recipe generator 204 may modify and/or adjust scanner routes that are generated by the layer generator 206. In this way, the recipe generator 204 is configured to reduce the distance of a scanner route so as to increase the efficiency of the scanner route and to reduce the time duration of the scanner route, which increases the performance of the lithography system 100. As an example, the recipe generator 204 is configured to reduce the distance of a scanner route based on the types of fields that are included in an exposure recipe to optimize the scanner route for the specific configuration of field types included in the exposure recipe. The scanner controller 202 is configured to communicate with the substrate stage 136 to cause the substrate stage 136 to omit non-exposure fields from a scanner route that was generated by the recipe generator 204.

As indicated above, FIG. 2 is provided as an example. Other examples may differ from what is described with regard to FIG. 2.

FIGS. 3A-3E are diagrams of an example implementation 300 described herein. The example implementation 300 includes an example of generating an exposure recipe for exposing a semiconductor substrate 302 (or a plurality of semiconductor substrates 302) in an exposure operation. In particular, the example implementation 300 includes an example of generating an exposure recipe that includes a plurality of adjacent and consecutive non-exposure fields. The plurality of adjacent and consecutive non-exposure fields may be included at the beginning of a scanner route, after the beginning but before the end of the scanner route, and/or at the end of the scanner route.

Figure 3A:
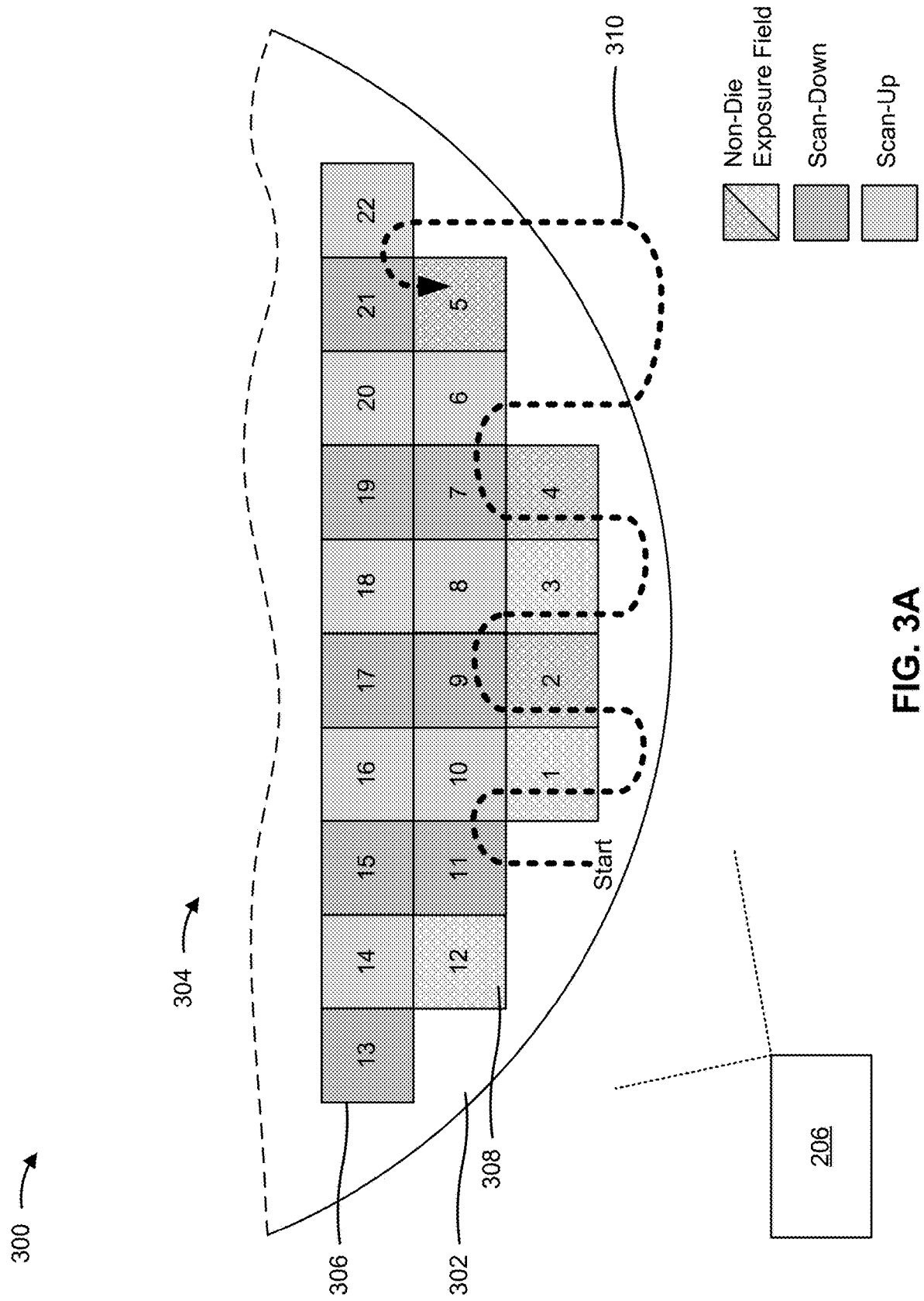
FIGS. 3A-3E, 4A-4E, and 5A-5C are diagrams of example implementations described herein.

As shown in FIG. 3A, the semiconductor substrate 302 includes a plurality of fields (e.g., die fields). The fields are numbered in sequential order (e.g., field 1-22 and so on), which represents the order in which the fields are to be processed. It is to be noted that the example implementation 300 illustrates only a portion of the semiconductor substrate 302, and the techniques and operations described in connection with FIGS. 3A-3E may be performed in other areas of the semiconductor substrate 302.

As shown in FIG. 3A, the layer generator 206 generates an exposure field map 304 for the exposure operation. The exposure field map 304 includes a line layer map or another type of layer map that includes a plurality of die exposure fields 306 and one or more non-die exposure fields 308. As shown in FIG. 3A, the non-die exposure field(s) 308 are located at the edge of the semiconductor substrate 302. In other words, the non-die exposure field(s) 308 are the outer-most fields on the semiconductor substrate 302 in the exposure field map 304.

As further shown in FIG. 3A, the exposure field map 304 includes a scan-up scan-down (SUSD) configuration in which the layer generator 206 assigns the die exposure fields 306 to scan-up operations and scan-down operations. In the example shown in FIG. 3A, the die exposure fields 6, 8, 10, 14, 16, 18, 20, and 22 are assigned scan-up operations and the die exposure fields 7, 9, 11, 13, 15, 17, 19, and 21 are assigned scan-down operations. Moreover, the non-die exposure fields 1, 3, and 12 are assigned scan-up operations and the non-die exposure fields 2, 4, and 5 are assigned scan-down operations.

A scan-up operation includes an operation in which the substrate stage 136 is to traverse a field from the bottom of the field to the top of the field. A scan-down operation includes an operation in which the substrate stage 136 is to traverse a field from the top of the field to the bottom of the field. While the scan-up operation and the scan-down operation are described in reference to the "top" and the "bottom" of a field, the scan-up operation and the scan-down operation generally may refer to opposing directions of traversal across a field on a semiconductor substrate (e.g., from left to right or from right to left).

As further shown in FIG. 3A, the layer generator 206 generates a scanner route 310 for the exposure field map 304. The scanner route 310 refers to the path that the substrate stage 136 is to travel in the exposure operation of the semiconductor substrate 302. In particular, the scanner route 310 corresponds to the point of focus of the radiation 106 (or the field focus of the exposure tool 104) onto the semiconductor substrate 302. The layer generator 206 generates the scanner route 310 such that the substrate stage 136 moves the field focus on the semiconductor substrate 302 from field to field based on the SUSD configuration. As an example, the substrate stage 136 is to traverse through the field 1 from the top of the field 1 to the bottom of the field 2 (scan-down operation), proceed to the field 2 and traverse through the field 2 from the bottom of the field 2 to the top of the field 2 (scan-up operation), and so on based on the scanner route 310.

The substrate stage 136 is to traverse along the scanner route 310 such that the die exposure fields 306 and the non-die exposure fields 308 are exposed to the radiation 106 in the exposure operation. As shown in FIG. 3A, the scanner route 310 includes moving the semiconductor substrate 302 (e.g., relative to the field focus of the exposure tool 104) in a looping or snaking path in which the substrate stage 136 moves the semiconductor substrate 302 from a starting point through the non-die exposure fields 308 in the same row in an alternating manner. The scanner route 310 may be configured to cause the substrate stage 136 to move the semiconductor substrate 302 along the other rows of fields on the semiconductor substrate 302 (which may include die exposure fields 306 and/or non-die exposure fields 308) in a similar manner.

Moreover, the substrate stage 136 is to traverse between rows of fields on the semiconductor substrate 302 based on the scanner route 310, as shown in the example in FIG. 3A. In particular, the substrate stage 136 is to move the field focus on the semiconductor substrate 302 over to the right of the field 4 (e.g., after scanning through the field 4), downward and over to past the right side of the field 5, up along the right side of the field 5, and then back to the left and down through the field 5 (scan-down operation) from the top of the field 5 to the bottom of the field 5.

Figure 3B:
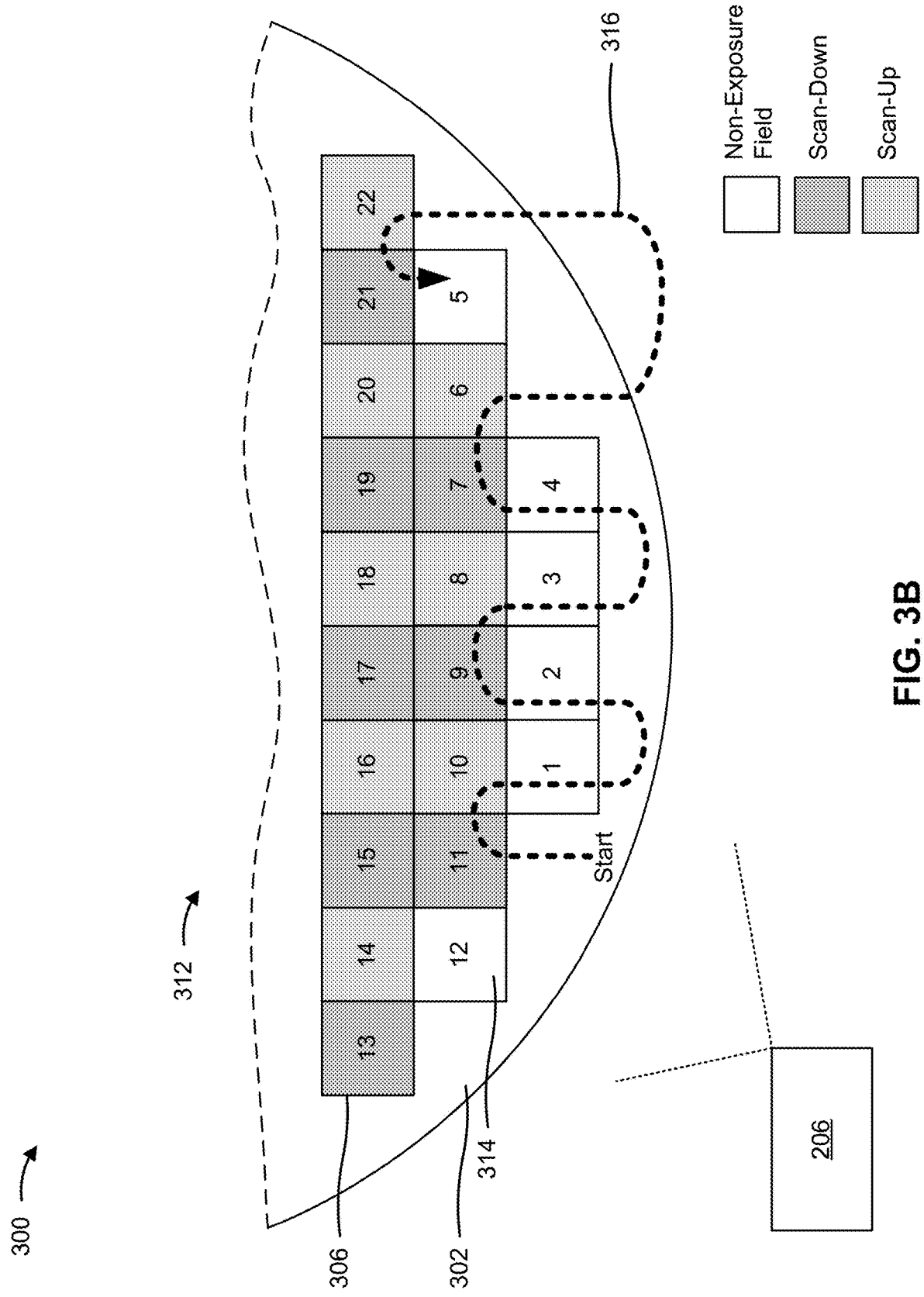

As shown in FIG. 3B, the layer generator 206 generates an exposure field map 312. The exposure field map 312 includes a hole layer map or another type of layer map that includes the die exposure fields 306 and one or more non-exposure fields 314. The non-exposure fields 314 include fields of the semiconductor substrate 302 in which the exposure tool 104 is to refrain from exposing the semiconductor substrate 302 in the exposure operation.

The configuration of the die exposure fields 306, the SUSD configuration, and the scanner route 316 may be the same as the exposure field map 304. However, the non-die exposure fields 308 of the exposure field map 304 are replaced with the non-exposure fields 314 at and/or along the edge of the semiconductor substrate 302. Thus, the scanner route 316 includes moving the semiconductor substrate 302 (e.g., relative to the field focus of the exposure tool 104) in a looping or snaking path in which the substrate stage 136 moves the semiconductor substrate 302 from a starting point through the non-exposure fields 314 in the same row in an alternating manner. Moreover, the scanner route 316 is configured to cause the substrate stage 136 to move the semiconductor substrate 302 in a large looping manner at the end of the first row of fields (e.g., fields 1-4) to the second row of fields (e.g., fields 5-12) such that the looping or snaking path may continue in the second row starting with the appropriate scan-down operation in field 5.

Figure 3C:
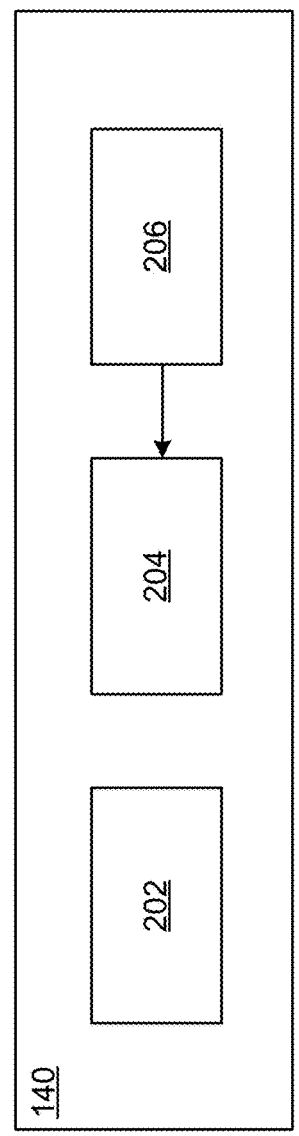

As shown in FIG. 3C, the layer generator 206 may provide the exposure field maps 304 and 312 (including the SUSD configurations and the scanner routes 310 and 316) to the recipe generator 204 so that the recipe generator 204 may generate an exposure recipe for the exposure operation based on the exposure field maps 304 and 312. Additionally or alternatively, the layer generator 206 may store the exposure field maps 304 and 312 in a data structure (not shown), which may be included in the scanner control system 140 or may be separate from the scanner control system 140. This permits the recipe generator 204 to obtain the exposure field maps 304 and 312 from the data structure.

Figure 3D:
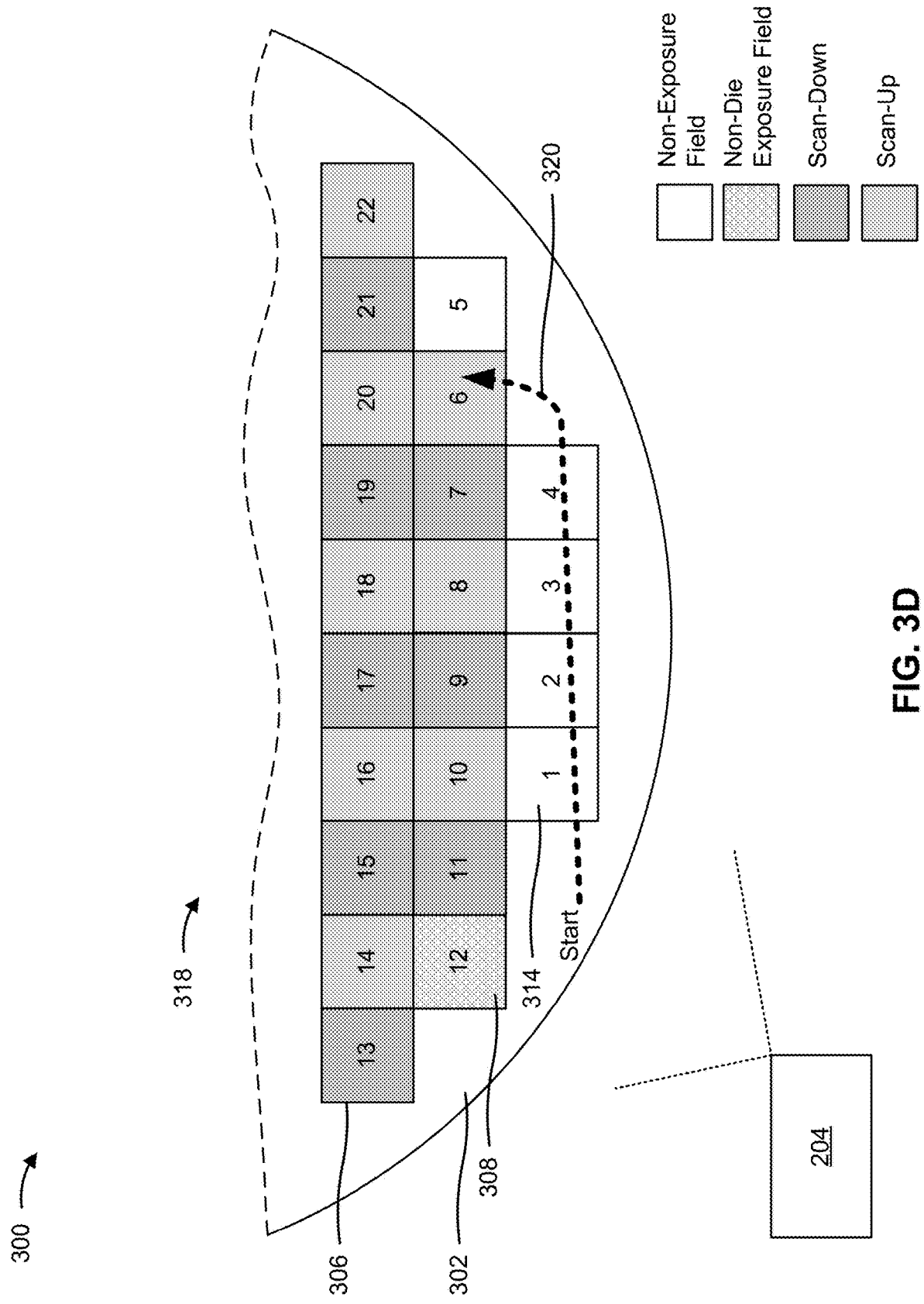

As shown in FIG. 3D, the recipe generator 204 generates an exposure recipe 318 for the exposure operation. The recipe generator 204 may generate the exposure recipe 318 based on the exposure field maps 304 and 312 (including the SUSD configurations and the scanner routes 310 and 316). As shown in FIG. 3D, the exposure recipe 318 includes the die exposure fields 306 and one or more of the non-exposure fields 314 from the exposure field map 312. The die exposure fields 306 are to be exposed in the exposure operation, whereas exposure of the non-exposure fields 314 is to be skipped (e.g., the radiation dosage for the non-exposure fields 314 is to be set to 0) in the exposure operation. In some implementations, the exposure recipe 318 may additionally include one or more non-die exposure fields 308 from the exposure field map 304. The non-die exposure fields 308 are to be exposed in the exposure operation.

In some implementations, the recipe generator 204 determines the configuration of non-die exposure fields 308 and non-exposure fields 314 based on input received from an operator of the lithography system 100. For example, the operator may identify which fields are to be non-die exposure fields 308 and which fields are to be non-exposure fields 314. In some implementations, the recipe generator 204 automatically determines which fields are to be non-die exposure fields 308 and which fields are to be non-exposure fields 314 based on one or more parameters for the exposure operation, such as contrast threshold for the die exposure fields 306, a focus leveling parameter, a pattern configuration of the reticle 108 that is to be used in the exposure operation, an overlay alignment threshold for the exposure operation, among other examples.

As further shown in FIG. 3D, the exposure recipe 318 further includes a scanner route 320 for traversing between the die exposure fields 306, the non-die exposure field(s) 308, and the non-exposure field(s) 314. The scanner route 320 is modified and/or adjusted from the scanner routes 310 and 316. In particular, the non-exposure fields 314 are omitted from the scanner route 320 to reduce, minimize, and/or otherwise optimize the path traveled by the substrate stage 136 in the exposure operation. As described above, the non-exposure fields 314 are fields that are not exposed during the exposure operation. Thus, following the same looping or snaking path in which the substrate stage 136 moves in an alternating manner through a plurality of adjacent and consecutive non-exposure fields 314 in the scanner route 312 as was configured in the scanner route 310 for the non-die exposure fields 308 results in an inefficient path of travel through the fields 1-4 in the exposure recipe 318. This is because the non-die exposure fields 308 are not exposed and do not need to be scanned in a particular direction. In other words, these non-die exposure fields 308 may be skipped entirely from the scanner route 320.

Accordingly, and as shown in the scanner route 320 in FIG. 3D, the recipe generator 204 may generate the scanner route 320 such that the fields 1-4 (which are non-die exposure fields 308) are skipped such that the substrate stage 136 traverses across the fields 1-4 in a short and direct path from the starting point of the exposure operation. Moreover, the recipe generator 204 generates the scanner route 320 such that field 5 (which is a non-exposure field 314 at the beginning of the second row of the semiconductor substrate 302) is also skipped instead of traversing from the first row to the second row in the large looping manner in the scanner routes 310 and 316.

In this way, the scanner route 320 is generated to cause the substrate stage 136 to proceed directly from the starting point in the exposure operation to the first die exposure field 306 (field 6) or the first non-die exposure field 308 in the exposure recipe 318. This may include proceeding from the starting point to the first die exposure field 306 or the first non-die exposure field 308 in an approximately straight and direct line (e.g., as shown in FIG. 3D for fields 1-4). Moreover, this may include refraining from traversing over a non-exposure field 314 entirely (e.g., as shown in FIG. 3D for field 5). The scanner route 320 may cause the substrate stage 136 to traverse directly over and/or across one or more non-exposure fields 314 and/or to avoid one or more non-exposure fields 314 entirely without performing scan up or scan down routing operations for these non-exposure fields 314. In this way, the scanner route 320 is optimized to reduce the distance traveled by the substrate stage 136 (and thus, the semiconductor substrate 302) in the exposure operation, which reduces the time duration of the exposure operation.

Figure 3E:
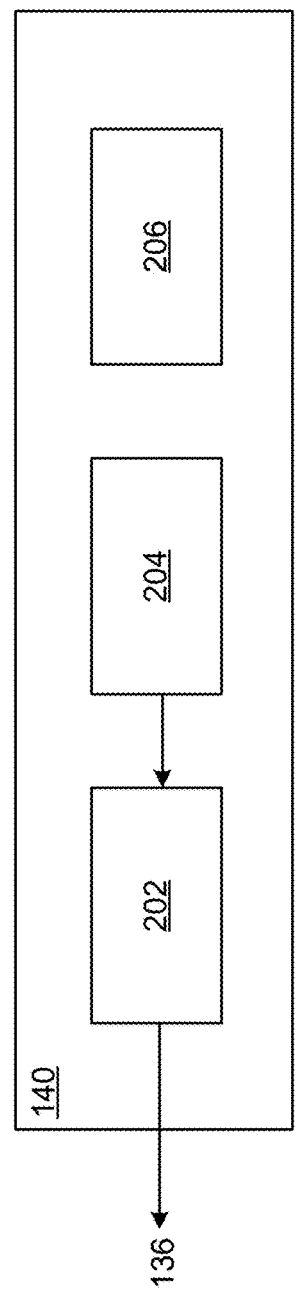

As shown in FIG. 3E, the recipe generator 204 may provide the exposure recipe 318 (including the SUSD configuration and the scanner route 320) to the scanner controller 202 so that the scanner controller 202 may control the substrate stage 136 (and/or other components of the exposure tool 104) in the exposure operation based on the exposure recipe 318. Additionally or alternatively, the recipe generator 204 may store the exposure recipe 318 in a data structure (not shown), which may be included in the scanner control system 140 or may be separate from the scanner control system 140. This permits the scanner controller 202 to obtain the exposure recipe 318 from the data structure.

The scanner controller 202 provides input (e.g., signals, communications) to the substrate stage 136 to cause the substrate stage 136 to step and/or otherwise move the semiconductor substrate 302 along the scanner route 320 in the exposure operation. In particular, the scanner controller 202 provides input to the substrate stage 136 to cause the substrate stage 136 to skip the non-exposure fields 314 in the exposure recipe 318 and to otherwise travel the shortest distance between die exposure fields 306 and non-die exposure fields 308 to reduce the time duration of the exposure operation, which increases the efficiency and throughput of the lithography system 100.

As indicated above, FIGS. 3A-3E are provided as an example. Other examples may differ from what is described with regard to FIGS. 3A-3E.

FIGS. 4A-4E are diagrams of an example implementation 400 described herein. The example implementation 400 includes an example of generating an exposure recipe for exposing a semiconductor substrate 402 (or a plurality of semiconductor substrates 302) in an exposure operation. In particular, the example implementation 400 includes an example of generating an exposure recipe that includes one or more non-exposure fields at an end of a row of fields on the semiconductor substrate 402.

Figure 4A:
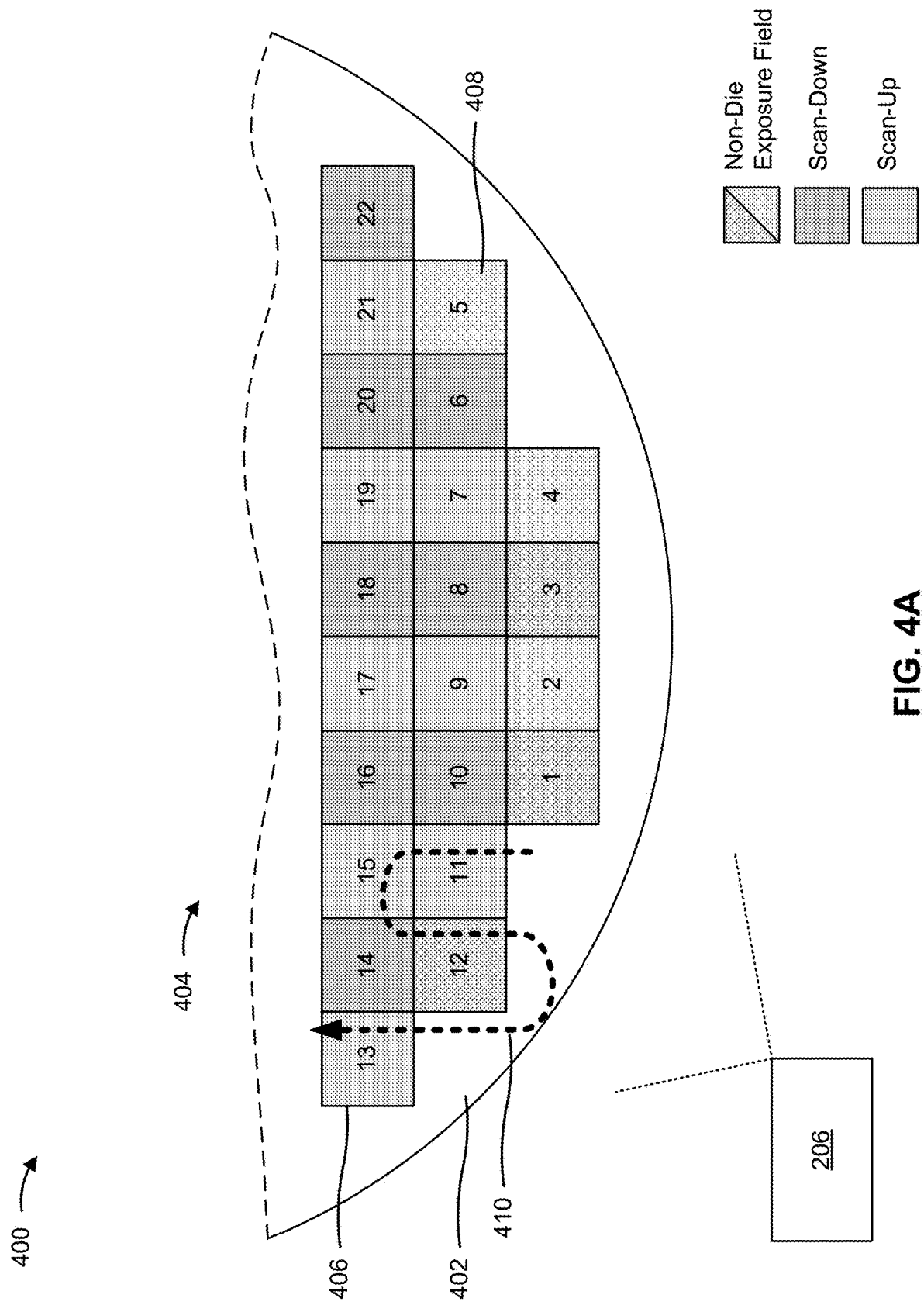

As shown in FIG. 4A, the layer generator 206 generates an exposure field map 404 for the exposure operation. The exposure field map 404 includes a line layer map or another type of layer map that includes a plurality of die exposure fields 406 and one or more non-die exposure fields 408. The layer generator 206 further generates a scanner route 410 for the exposure field map 404.

Figure 4B:
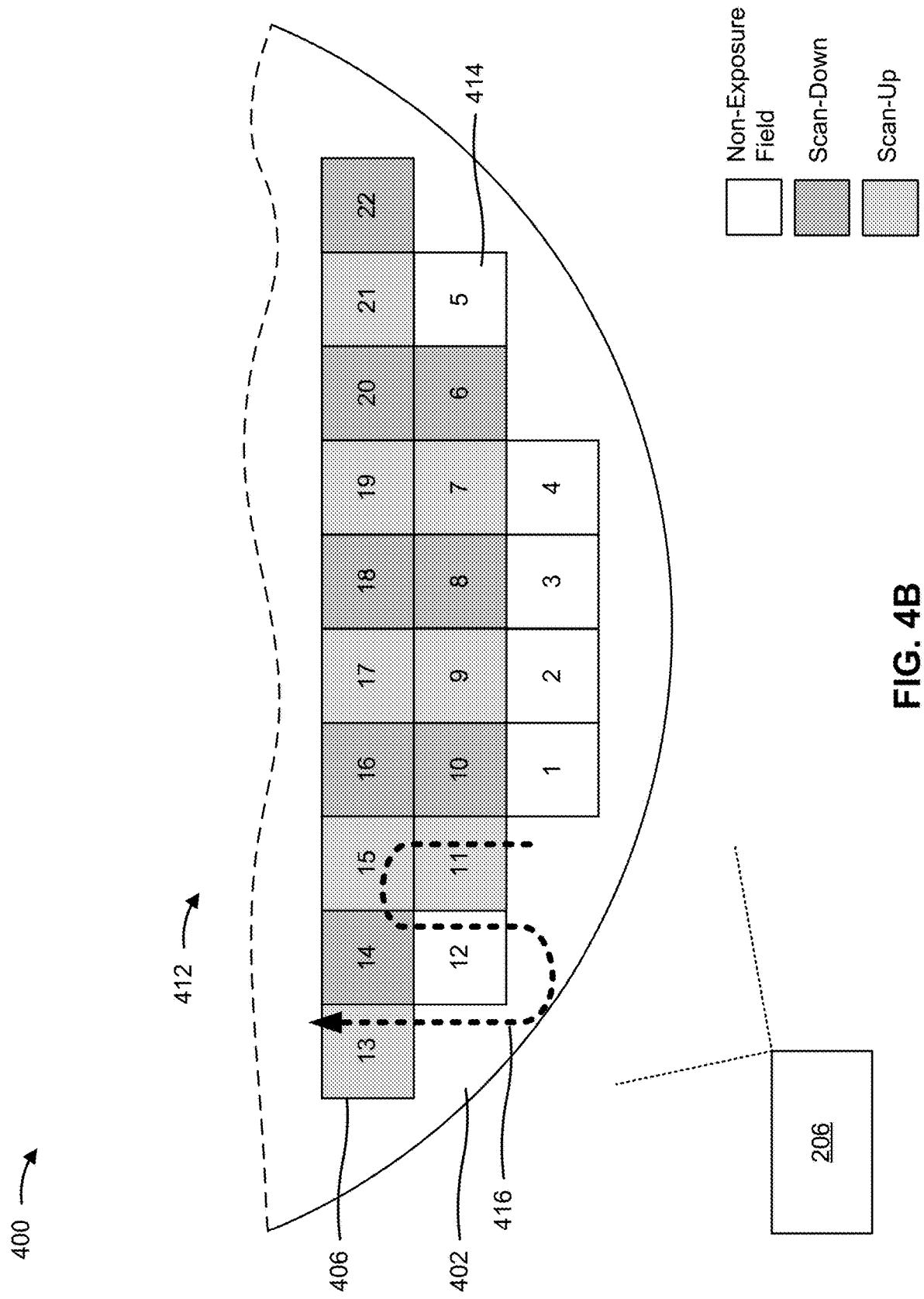

As shown in FIG. 4B, the layer generator 206 generates an exposure field map 412. The exposure field map 412 includes a hole layer map or another type of layer map that includes the die exposure fields 406 and one or more non-exposure fields 414. The layer generator 206 further generates a scanner route 416 for the exposure field map 412, which is the same as the scanner route 410 for the exposure field map 404.

Figure 4C:
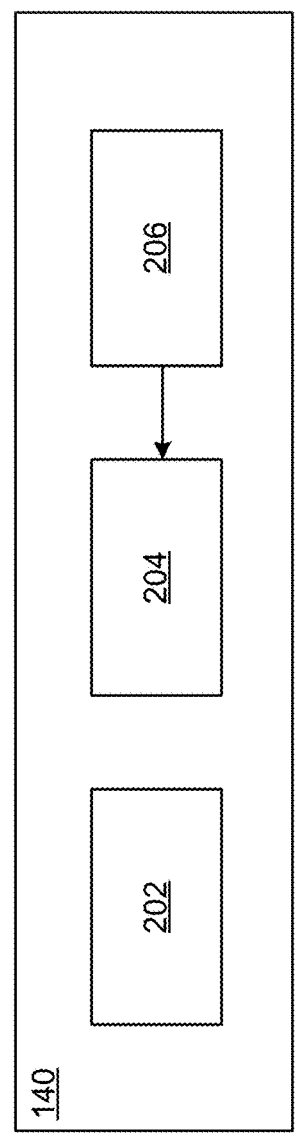

As shown in FIG. 4C, the layer generator 206 may provide the exposure field maps 404 and 412 (including the SUSD configurations and the scanner routes 410 and 416) to the recipe generator 204 so that the recipe generator 204 may generate an exposure recipe for the exposure operation based on the exposure field maps 404 and 412. Additionally or alternatively, the layer generator 206 may store the exposure field maps 404 and 412 in a data structure (not shown), which may be included in the scanner control system 140 or may be separate from the scanner control system 140. This permits the recipe generator 204 to obtain the exposure field maps 404 and 412 from the data structure.

Figure 4D:
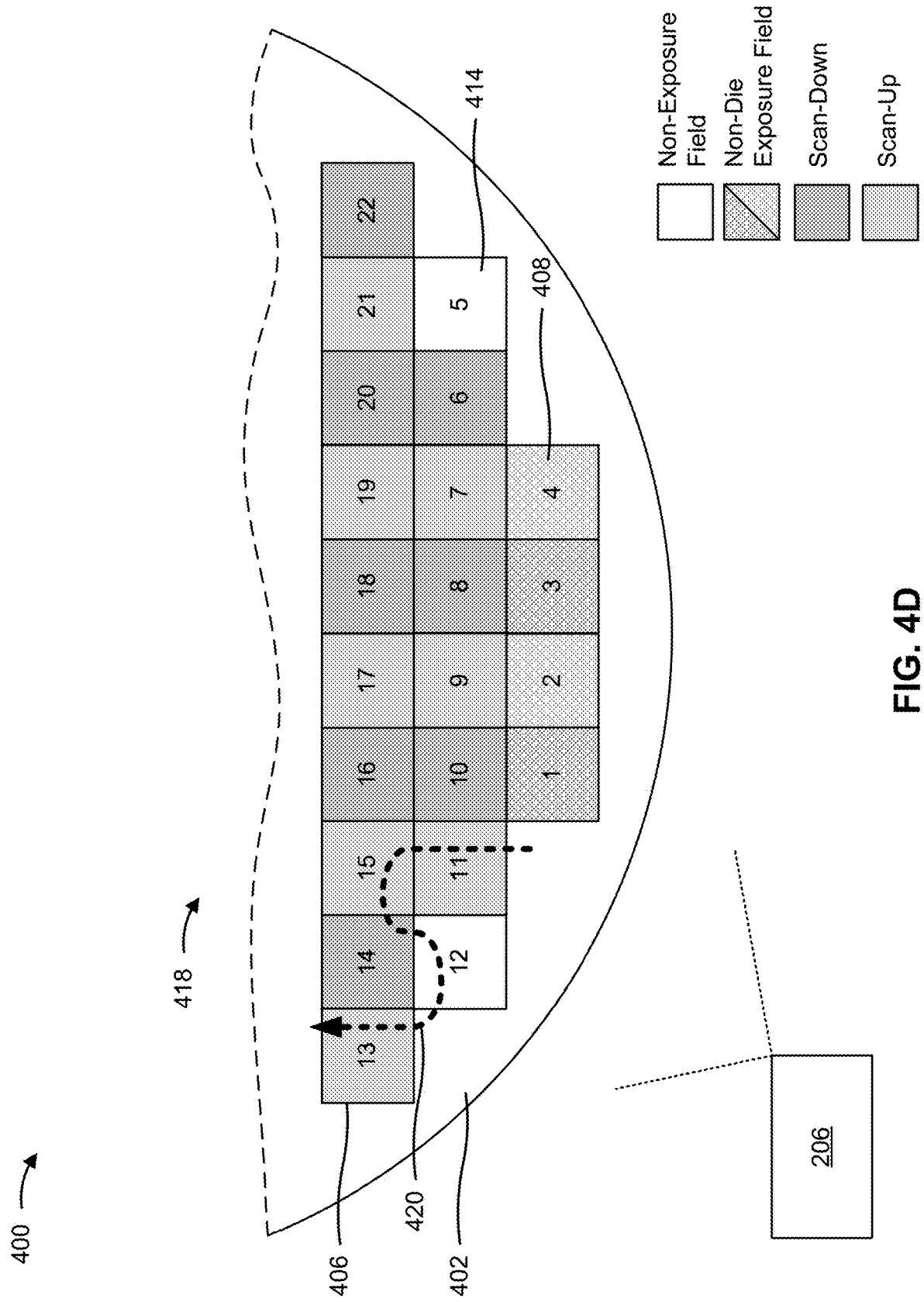

As shown in FIG. 4D, the recipe generator 204 generates an exposure recipe 418 for the exposure operation. The recipe generator 204 may generate the exposure recipe 418 based on the exposure field maps 404 and 412 (including the SUSD configurations and the scanner routes 410 and 416). Moreover, the exposure recipe 418 includes a scanner route 420 for traversing between the die exposure fields 406, the non-die exposure field(s) 408, and the non-exposure field(s) 414.

As shown in FIG. 4D, the scanner route 420 is modified and/or adjusted from the scanner routes 410 and 416 to skip over the field 12, which includes a non-exposure field 414 at the end of the second row of fields on the semiconductor substrate 402. The scanner route 420 is configured to cause the substrate stage 136 to traverse through the field 11 in a scan-up operation, and then to travel across field 12 (e.g., refraining from performing a scan-up operation or a scan-down operation on the field 12) in preparation for a scan-up operation for field 13. In this way, the scanner route 420 is configured to cause the substrate stage 136 to skip over a non-exposure field 414 at the end of a row of fields, and to proceed to the next row of fields in a more direct and efficient path of travel.

Figure 4E:
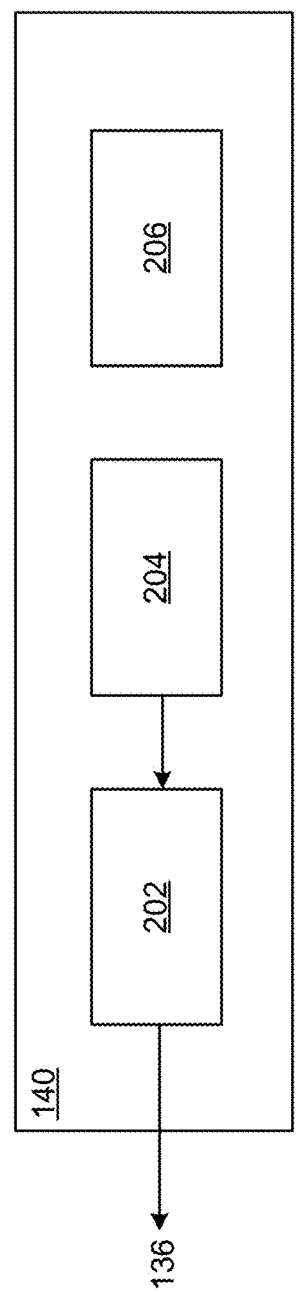

As shown in FIG. 4E, the recipe generator 204 may provide the exposure recipe 418 (including the SUSD configuration and the scanner route 420) to the scanner controller 202 so that the scanner controller 202 may control the substrate stage 136 (and/or other components of the exposure tool 104) in the exposure operation based on the exposure recipe 418. Additionally or alternatively, the recipe generator 204 may store the exposure recipe 418 in a data structure (not shown), which may be included in the scanner control system 140 or may be separate from the scanner control system 140. This permits the scanner controller 202 to obtain the exposure recipe 418 from the data structure.

The scanner controller 202 provides input (e.g., signals, communications) to the substrate stage 136 to cause the substrate stage 136 to step and/or otherwise move the semiconductor substrate 402 along the scanner route 420 in the exposure operation. In particular, the scanner controller 202 provides input to the substrate stage 136 to cause the substrate stage 136 to skip the non-exposure fields 414 in the exposure recipe 418 and to otherwise travel the shortest distance between die exposure fields 406 and non-die exposure fields 408 to reduce the time duration of the exposure operation, which increases the efficiency and throughput of the lithography system 100.

As indicated above, FIGS. 4A-4E are provided as an example. Other examples may differ from what is described with regard to FIGS. 4A-4E.

Figure 5A:
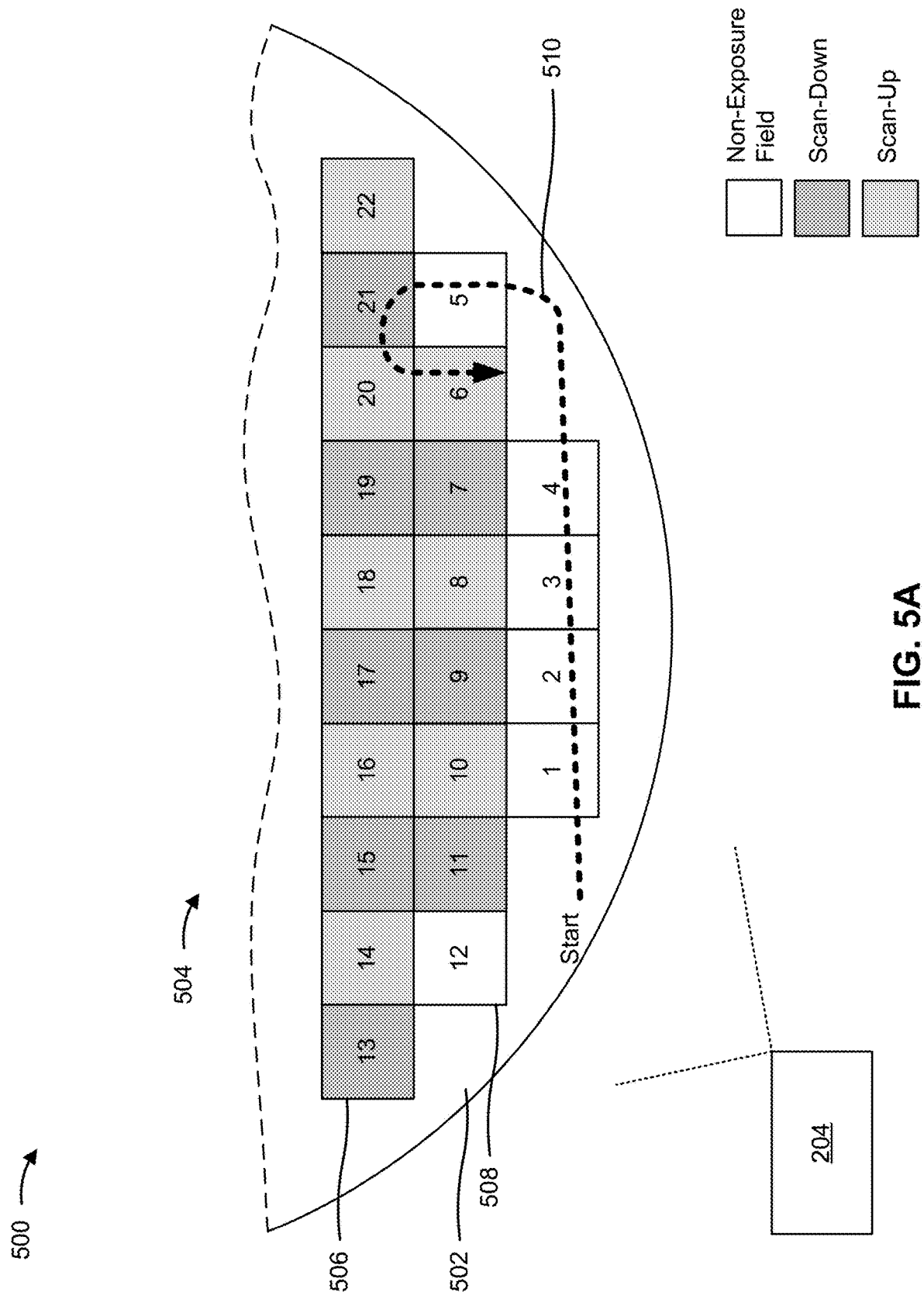
Figure 5B:
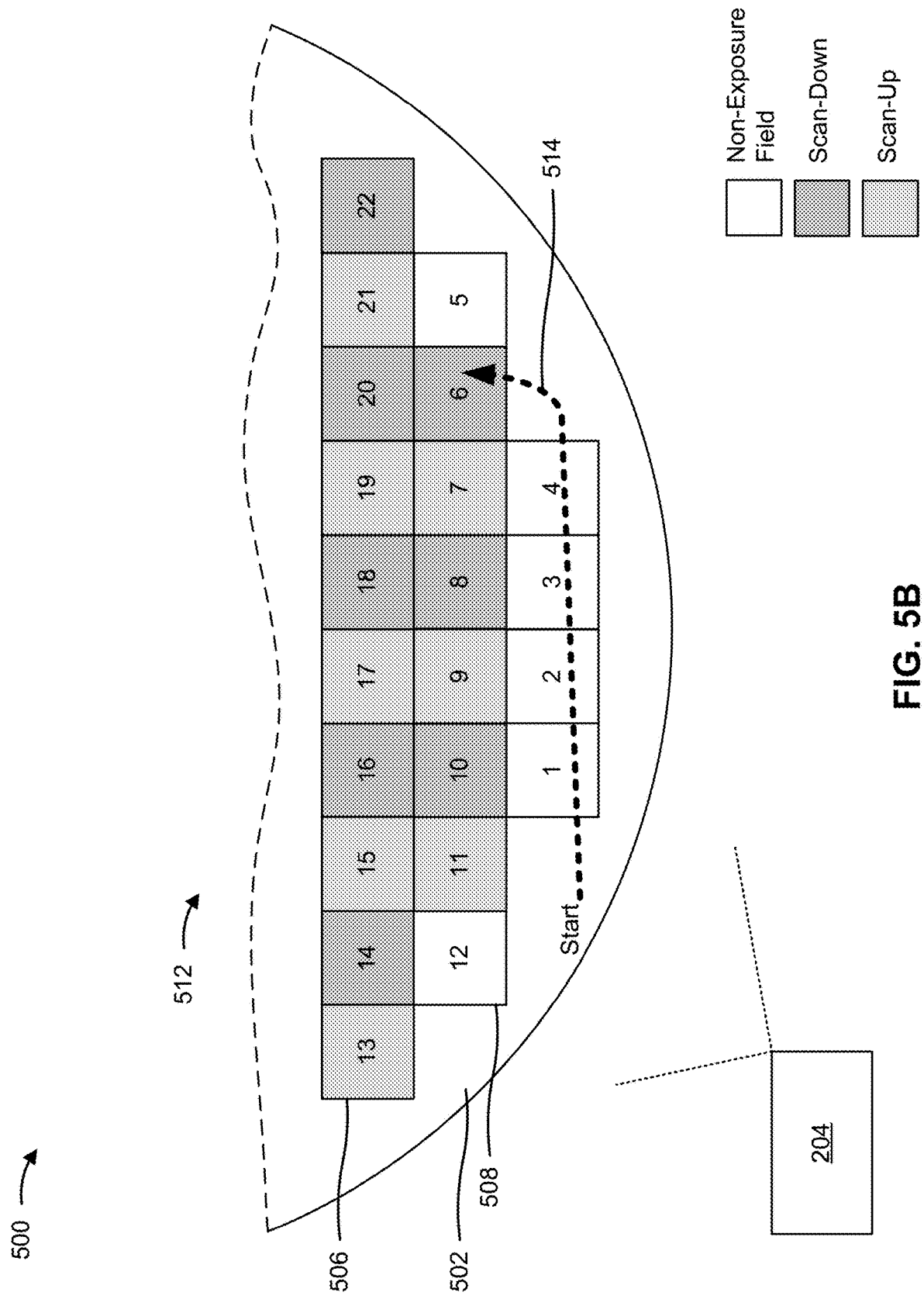
Figure 5C:
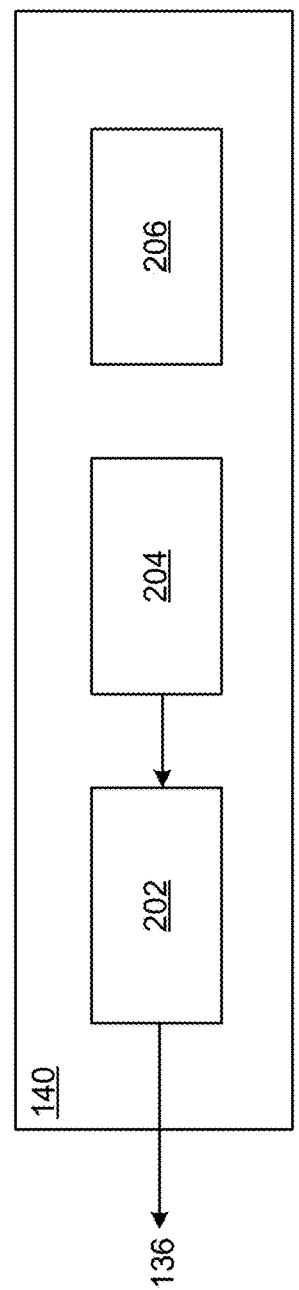

FIGS. 5A-5C are diagrams of an example implementation 500 described herein. The example implementation 500 includes an example of modifying an exposure recipe for exposing a semiconductor substrate 502 (or a plurality of semiconductor substrates 502) in an exposure operation. In particular, the example implementation 500 includes an example of modifying an exposure recipe that includes one or more non-exposure fields to reduce a scanner route for the exposure recipe based on the exposure recipe being for a non-critical layer of the semiconductor substrate 502. In this way, the length or the distance of the scanner route may be reduced using techniques associated with non-critical layers of a semiconductor substrate.

As shown in FIG. 5A, the recipe generator 204 generates an exposure recipe 504. The exposure recipe 504 includes a plurality of die exposure fields 506 and a plurality of non-exposure fields 508. As further shown in FIG. 5A, the recipe generator 204 generates a scanner route 510 for the exposure recipe 504. The recipe generator 204 generates the scanner route 510 to optimize the path of the scanner route 510 based on the SUSD configuration of the exposure recipe 504 and based on the layout or configuration of the die exposure fields 506 and the non-exposure fields 508.

As shown in FIG. 5B, the recipe generator 204 generates an exposure recipe 512, which may include a modified version of the exposure recipe 504. In the exposure recipe 512, the recipe generator 204 modifies the SUSD configuration of the exposure recipe 504 to further increase the efficiency of (e.g., the distance or length of) the scanner route 514. In particular, the recipe generator 204 flips or inverts the SUSD configuration of the semiconductor substrate 502 such that the scanner route 514 causes the substrate stage 136 to travel from the field 4 (e.g., a non-exposure field 508) to the field 6 (e.g., a die exposure field 506) due to the field 6 now being configured with a scan-up operation. In this way, switching the field 6 from a scan-down operation to a scan-up operation enables the field 5 (e.g., a non-exposure field 508) to be skipped or avoided entirely in the scanner route 514, as opposed to having the substrate stage 136 traverse the field 5 to perform a scan-down operation in field 6 based on the scanner route 510. Thus, the length of the scanner route 514 is less than the length of the scanner route 510, which reduces the time duration of the exposure operation for the semiconductor substrate 502.

In some implementations, the recipe generator 204 generates the exposure recipe 512 based on determining to reduce the scanner route 510 (e.g., the distance or length of the scanner route 510). The recipe generator 204 may determine to reduce the scanner route 510 based on whether the exposure recipe 504 is for a critical layer or a non-critical layer for the semiconductor substrate 502. A critical layer may include a layer of the semiconductor substrate 502 in which sizes and/or other parameters of the structures that are to be formed in the layer are to be highly controlled. A critical layer may be a part of the formation of structures that might otherwise cause device failures or reduced yield on the semiconductor substrate 502 due to reduced overlay performance and/or due to reduced parameter control. Non-critical layers may include relatively larger structures, such as back end of line (BEOL) metallization layers and/or other types of relatively large structures. Critical layers may include relatively smaller structures, such as epitaxial regions (e.g., source or drain regions), gate structures, and/or other front end of line (FEOL) structures.

The recipe generator 204 may selectively modify the SUSD configuration of an exposure operation based on whether the exposure operation is for a critical layer. Due to the tight control that is used for exposure of a critical layer, the recipe generator 204 may not be permitted to modify the SUSD configuration of a critical layer. However, the recipe generator 204 may be permitted to modify the SUSD configuration of a non-critical layer. Accordingly, the recipe generator 204 may determine to reduce the scanner route 510 based on the exposure recipe 504 being for a non-critical layer. In some implementations, the recipe generator 204 determines to reduce the scanner route 510 based on determining that the exposure recipe 504 is for a non-critical layer and based on determining that a shorter scanner route 510 may be generated if the SUSD configuration of the exposure recipe 504 is modified.

In some implementations, the recipe generator 204 may generate the exposure recipe 512 (and the scanner route 514) using machine learning and/or artificial intelligence, in which constraints such as route length and/or exposure time duration are used as inputs to a trained machine learning model (e.g., trained on thousands (or more) of historical exposure recipe generation outcomes) to generate the exposure recipe 512 and the scanner route 514.

As shown in FIG. 5C, the recipe generator 204 may provide the exposure recipe 512 (including the SUSD configuration and the scanner route 514) to the scanner controller 202 so that the scanner controller 202 may control the substrate stage 136 (and/or other components of the exposure tool 104) in the exposure operation based on the exposure recipe 512. Additionally or alternatively, the recipe generator 204 may store the exposure recipe 512 in a data structure (not shown), which may be included in the scanner control system 140 or may be separate from the scanner control system 140. This permits the scanner controller 202 to obtain the exposure recipe 512 from the data structure.

The scanner controller 202 provides input (e.g., signals, communications) to the substrate stage 136 to cause the substrate stage 136 to step and/or otherwise move the semiconductor substrate 502 along the scanner route 514 in the exposure operation. In particular, the scanner controller 202 provides input to the substrate stage 136 to cause the substrate stage 136 to traverse through and between the die exposure fields 506 based on the modified SUSD configuration in the exposure recipe 512. Moreover, the scanner controller 202 provides input to the substrate stage 136 to cause the substrate stage 136 to skip the non-exposure fields 508 in the exposure recipe 512 and to otherwise travel the shortest distance between die exposure fields 506 to reduce the time duration of the exposure operation, which increases the efficiency and throughput of the lithography system 100.

As indicated above, FIGS. 5A-5C are provided as an example. Other examples may differ from what is described with regard to FIGS. 5A-5C.

Figure 6:
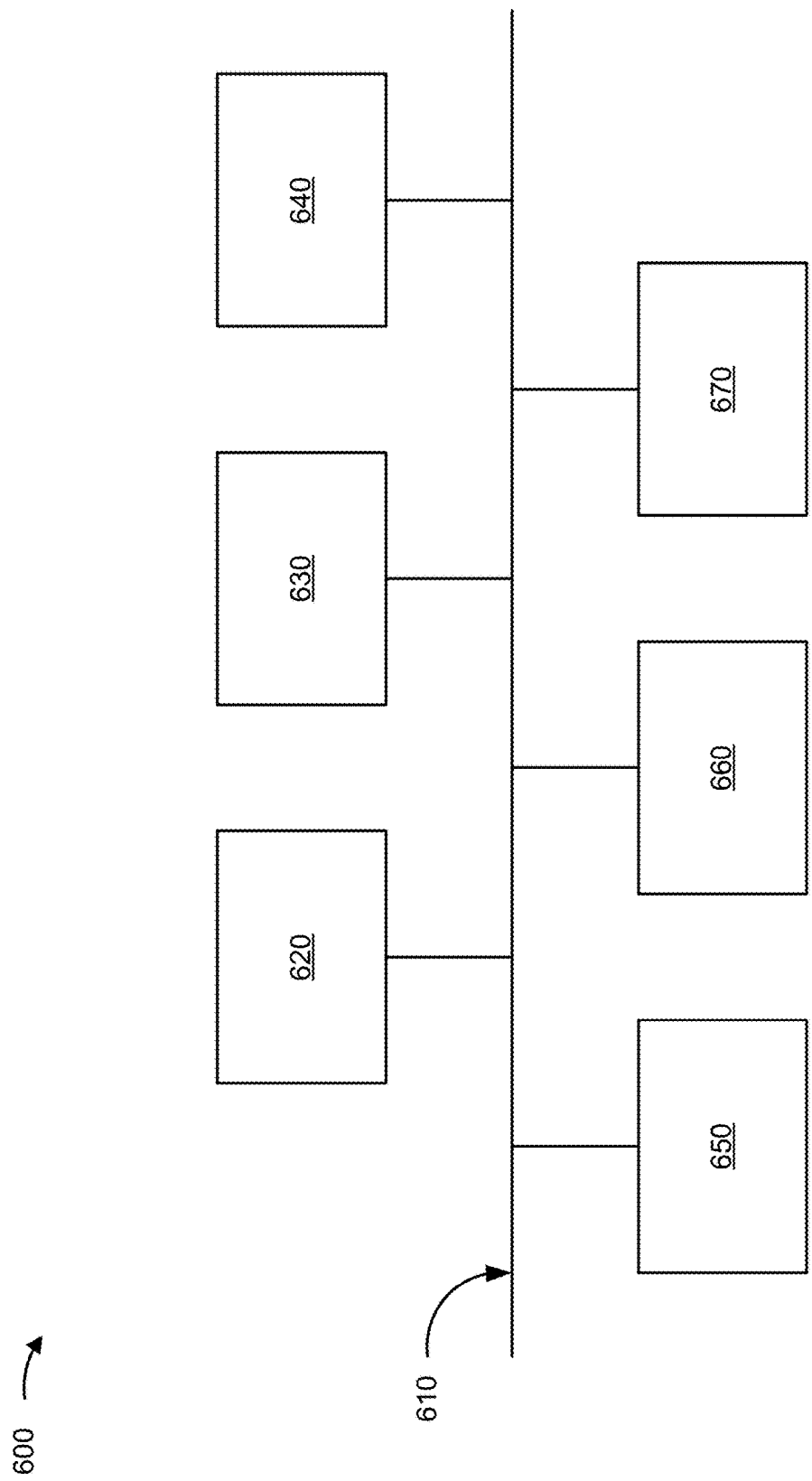
FIG. 6 is a diagram of example components of one or more devices of FIG. 1 described herein.

FIG. 6 is a diagram of example components of a device 600, which may correspond to the scanner control system 140, the scanner controller 202, the recipe generator 204, and/or the layer generator 206. In some implementations, the scanner control system 140, the scanner controller 202, the recipe generator 204, and/or the layer generator 206 may include one or more devices 600 and/or one or more components of device 600. As shown in FIG. 6, device 600 may include a bus 610, a processor 620, a memory 630, a storage component 640, an input component 650, an output component 660, and a communication component 670.

Bus 610 includes a component that enables wired and/or wireless communication among the components of device 600. Processor 620 includes a central processing unit, a graphics processing unit, a microprocessor, a controller, a microcontroller, a digital signal processor, a field-programmable gate array, an application-specific integrated circuit, and/or another type of processing component. Processor 620 is implemented in hardware, firmware, or a combination of hardware and software. In some implementations, processor 620 includes one or more processors capable of being programmed to perform a function. Memory 630 includes a random access memory, a read only memory, and/or another type of memory (e.g., a flash memory, a magnetic memory, and/or an optical memory).

Storage component 640 stores information and/or software related to the operation of device 600. For example, storage component 640 may include a hard disk drive, a magnetic disk drive, an optical disk drive, a solid state disk drive, a compact disc, a digital versatile disc, and/or another type of non-transitory computer-readable medium. Input component 650 enables device 600 to receive input, such as user input and/or sensed inputs. For example, input component 650 may include a touch screen, a keyboard, a keypad, a mouse, a button, a microphone, a switch, a sensor, a global positioning system component, an accelerometer, a gyroscope, and/or an actuator. Output component 660 enables device 600 to provide output, such as via a display, a speaker, and/or one or more light-emitting diodes. Communication component 670 enables device 600 to communicate with other devices, such as via a wired connection and/or a wireless connection. For example, communication component 670 may include a receiver, a transmitter, a transceiver, a modem, a network interface card, and/or an antenna.

Device 600 may perform one or more processes described herein. For example, a non-transitory computer-readable medium (e.g., memory 630 and/or storage component 640) may store a set of instructions (e.g., one or more instructions, code, software code, and/or program code) for execution by processor 620. Processor 620 may execute the set of instructions to perform one or more processes described herein. In some implementations, execution of the set of instructions, by one or more processors 620, causes the one or more processors 620 and/or the device 600 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 6 are provided as an example. Device 600 may include additional components, fewer components, different components, or differently arranged components than those shown in FIG. 6. Additionally, or alternatively, a set of components (e.g., one or more components) of device 600 may perform one or more functions described as being performed by another set of components of device 600.

Figure 7:
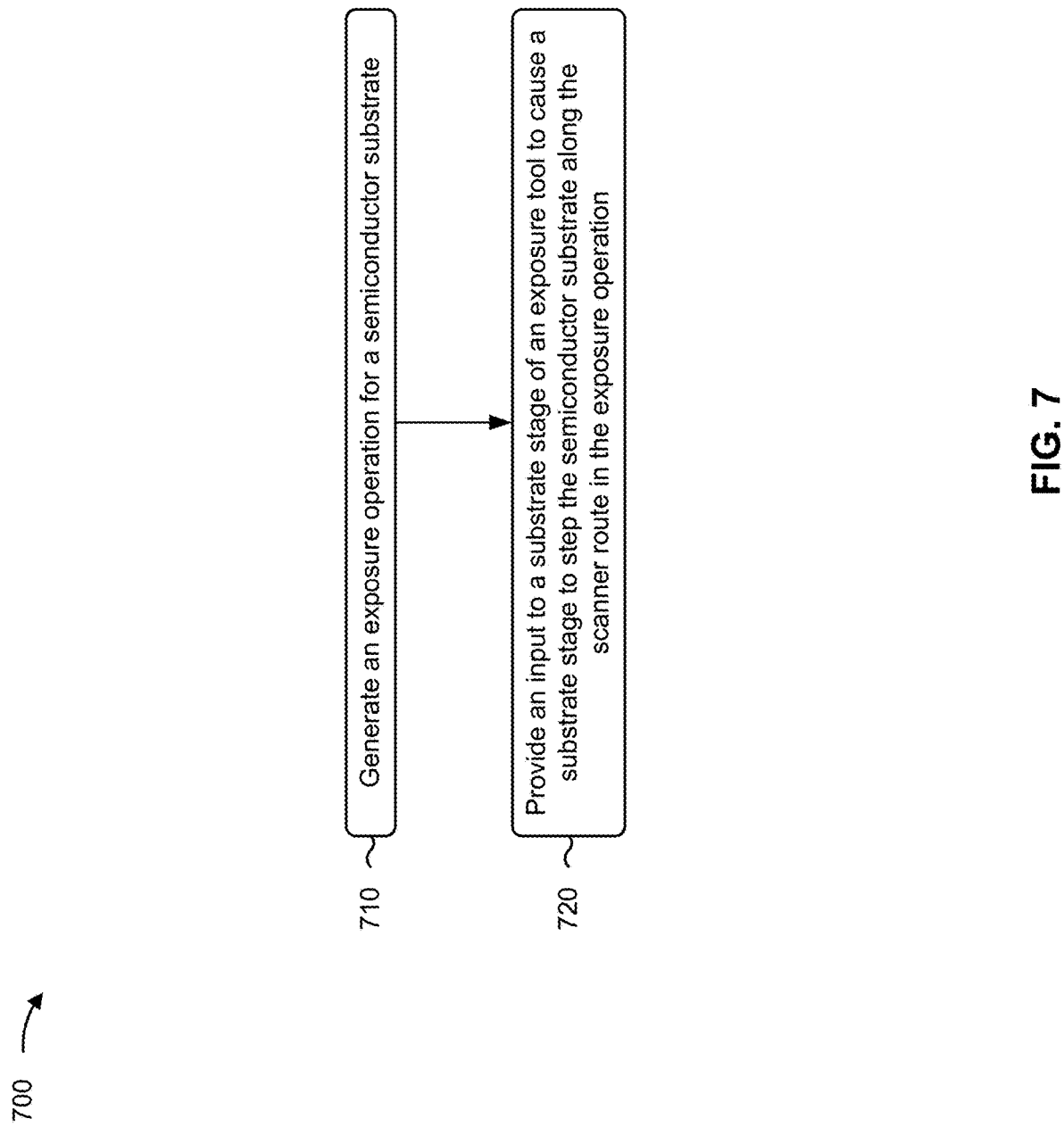
FIGS. 7 and 8 are flowcharts of an example process relating to generating an exposure recipe described herein.

FIG. 7 is a flowchart of an example process 700 associated with generating an exposure recipe. In some implementations, one or more process blocks of FIG. 7 may be performed by a scanner control system (e.g., the scanner control system 140). In some implementations, one or more process blocks of FIG. 7 may be performed by another device or a group of devices separate from or including the scanner control system, such as a scanner controller (e.g., the scanner controller 202), a recipe generator (e.g., the recipe generator 204), and/or a layer generator (e.g., the layer generator 206), among other examples. Additionally, or alternatively, one or more process blocks of FIG. 7 may be performed by one or more components of device 600, such as processor 620, memory 630, storage component 640, input component 650, output component 660, and/or communication component 670.

As shown in FIG. 7, process 700 may include generating an exposure for performing an exposure operation for a semiconductor substrate (block 710). For example, the scanner control system 140 may generate an exposure recipe (e.g., the exposure recipe 318, 418, and/or 512) for performing an exposure operation for a semiconductor substrate (e.g., the semiconductor substrate 110, 302, 402, and/or 502), as described above. In some implementations, the exposure recipe includes information identifying a plurality of die exposure fields (e.g., the die exposure fields 306, 406, and/or 506), on the semiconductor substrate, that are to be exposed in the exposure operation, one or more non-exposure fields (e.g., the non-exposure fields 314, 414, and/or 508), on the semiconductor substrate, for which exposure is to be skipped in the exposure operation, and a scanner route (e.g., the scanner route 320, 420, and/or 514) for traversing between the plurality of die exposure fields. In some implementations, the one or more non-exposure fields are omitted from the scanner route.

As further shown in FIG. 7, process 700 may include providing an input to a substrate stage of an exposure tool to cause the substrate stage to step the semiconductor substrate along the scanner route in the exposure operation (block 720). For example, the scanner control system 140 may provide an input to the substrate stage 136 of the exposure tool 104 to cause the substrate stage to step the semiconductor substrate along the scanner route in the exposure operation, as described above.

Process 700 may include additional implementations, such as any single implementation or any combination of implementations described below and/or in connection with one or more other processes described elsewhere herein.

In a first implementation, generating the exposure recipe includes generating a first exposure recipe (e.g., the exposure recipe 504) including a first scanner route (e.g., the scanner route 510), determining to reduce the first scanner route, and generating a second exposure recipe (e.g., the exposure recipe 512) to reduce the first scanner route based determining to reduce the first scanner route, where a length of a second scanner route (e.g., the scanner route 514) of the second exposure recipe is less than a length of the first scanner route. In a second implementation, alone or in combination with the first implementation, generating the first exposure recipe includes generating a first SUSD configuration for the first exposure recipe, and generating the second exposure recipe includes generating a second SUSD configuration for the second exposure recipe, where the first SUSD configuration and the second SUSD configuration are different SUSD configurations. In a third implementation, alone or in combination with one or more of the first and second implementations, determining to reduce the first scanner route includes determining that an exposure layer associated with the exposure operation is a non-critical exposure layer, and determining to reduce the first scanner route based on determining that the exposure layer is a non-critical exposure layer.

In a fourth implementation, alone or in combination with one or more of the first through third implementations, the one or more non-exposure fields include a plurality of adjacent non-exposure fields. In a fifth implementation, alone or in combination with one or more of the first through fourth implementations, the one or more non-exposure fields include a non-exposure field between two die exposure fields in a same row on the semiconductor substrate. In a sixth implementation, alone or in combination with one or more of the first through fifth implementations, the one or more non-exposure fields include a non-exposure field at an end of a row on the semiconductor substrate.

Although FIG. 7 shows example blocks of process 700, in some implementations, process 700 may include additional blocks, fewer blocks, different blocks, or differently arranged blocks than those depicted in FIG. 7. Additionally, or alternatively, two or more of the blocks of process 700 may be performed in parallel.

Figure 8:
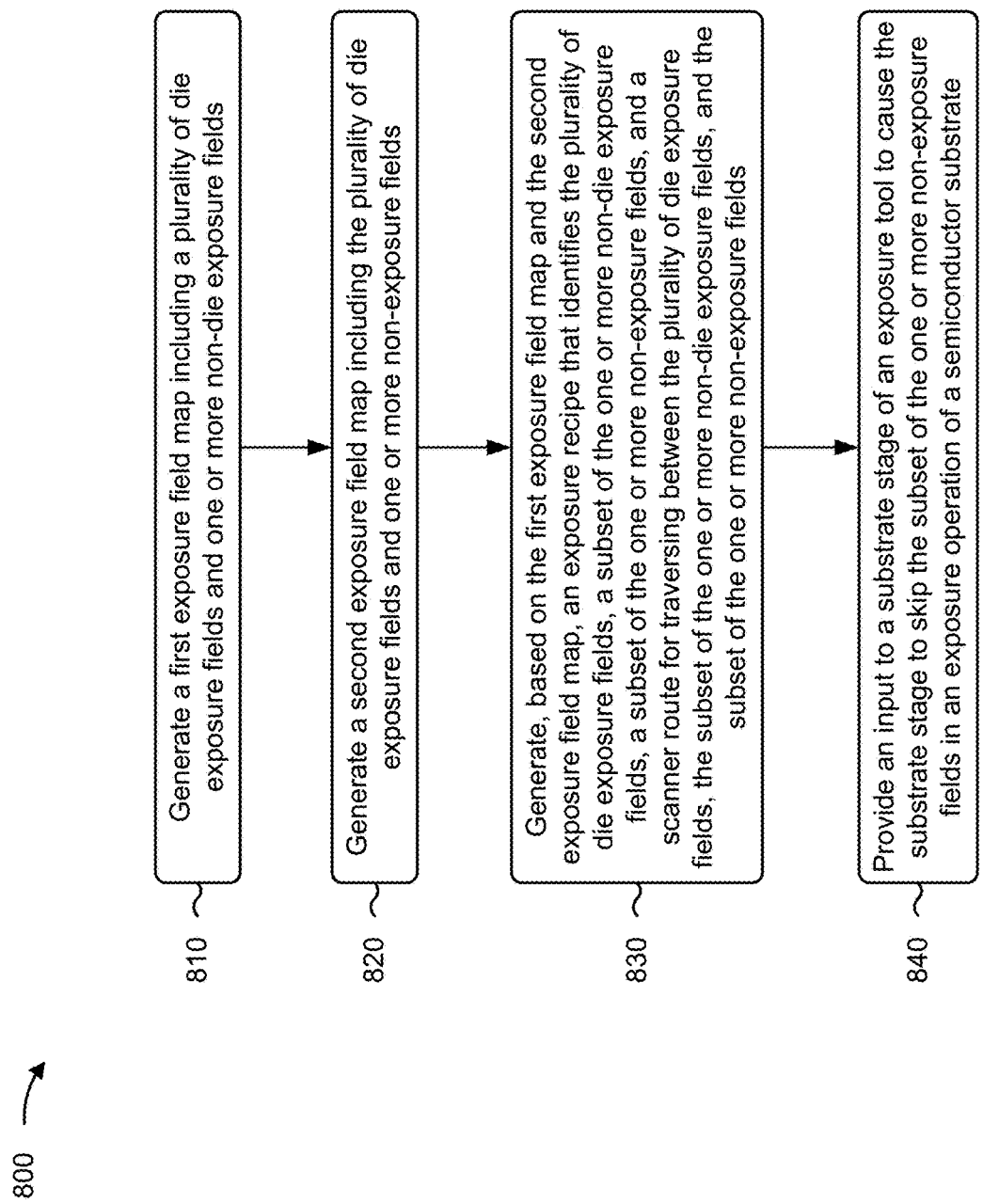

FIG. 8 is a flowchart of an example process 800 associated with generating an exposure recipe. In some implementations, one or more process blocks of FIG. 8 may be performed by a scanner control system (e.g., the scanner control system 140). In some implementations, one or more process blocks of FIG. 8 may be performed by another device or a group of devices separate from or including the scanner control system, such as a scanner controller (e.g., the scanner controller 202), a recipe generator (e.g., the recipe generator 204), and/or a layer generator (e.g., the layer generator 206), among other examples. Additionally, or alternatively, one or more process blocks of FIG. 8 may be performed by one or more components of device 600, such as processor 620, memory 630, storage component 640, input component 650, output component 660, and/or communication component 670.

As shown in FIG. 8, process 800 may include generating a first exposure field map including a plurality of die exposure fields and one or more non-die exposure fields (block 810). For example, the scanner control system 140 may generate a first exposure field map (e.g., the exposure field map 304 and/or 404) including a plurality of die exposure fields (e.g., the die exposure fields 306 and/or 406) and one or more non-die exposure fields (e.g., the non-die exposure fields 308 and/or 408), as described above.

As further shown in FIG. 8, process 800 may include generating a second exposure field map including the plurality of die exposure fields and one or more non-exposure fields (block 820). For example, the scanner control system 140 may generate a second exposure field map (e.g., the exposure field map 312 and/or 412) including the plurality of die exposure fields and one or more non-exposure fields (e.g., the non-exposure fields 314 and/or 414), as described above.

As further shown in FIG. 8, process 800 may include generating, based on the first exposure field map and the second exposure field map, an exposure recipe that identifies the plurality of die exposure fields, a subset of the one or more non-die exposure fields, a subset of the one or more non-exposure fields, and a scanner route for traversing between the plurality of die exposure fields, the subset of the one or more non-die exposure fields, and the subset of the one or more non-exposure fields (block 830). For example, the scanner control system 140 may generate, based on the first exposure field map and the second exposure field map, an exposure recipe (e.g., the exposure recipe 318 and/or 418) that identifies the plurality of die exposure fields, a subset of the one or more non-die exposure fields, a subset of the one or more non-exposure fields, and a scanner route (e.g., the scanner route 320, 420, and/or 514) for traversing between the plurality of die exposure fields, the subset of the one or more non-die exposure fields, and the subset of the one or more non-exposure fields, as described above.

As further shown in FIG. 8, process 800 may include providing an input to a substrate stage of an exposure tool to cause the substrate stage to skip the subset of the one or more non-exposure fields in an exposure operation of a semiconductor substrate (block 840). For example, the scanner control system 140 may provide an input to a substrate stage (e.g., the substrate stage 136) of an exposure tool (e.g., the exposure tool 104) to cause the substrate stage to skip the subset of the one or more non-exposure fields in an exposure operation of a semiconductor substrate (e.g., the semiconductor substrate 110, 302, 402, and/or 502), as described above.

Process 800 may include additional implementations, such as any single implementation or any combination of implementations described below and/or in connection with one or more other processes described elsewhere herein.

In a first implementation, the one or more non-exposure fields are located at an edge of the semiconductor substrate. In a second implementation, alone or in combination with the first implementation, the subset of the one or more non-exposure fields includes a plurality of adjacent non-exposure fields, and generating the exposure recipe includes generating the exposure recipe to cause the exposure tool to skip exposure of the plurality of adjacent non-exposure fields, and generating the scanner route to cause the substrate stage to proceed directly from a starting point in the exposure operation to a first die exposure field of the plurality of die exposure fields. In a third implementation, alone or in combination with one or more of the first and second implementations, the input to the substrate stage causes the substrate stage to proceed from the starting point to the first die exposure field in an approximately straight line across the plurality of adjacent non-exposure fields.

In a fourth implementation, alone or in combination with one or more of the first through third implementations, the input to the substrate stage causes the substrate stage to proceed from the starting point to the first die exposure field without performing scan up or scan down routing operations for the plurality of adjacent non-exposure fields. In a fifth implementation, alone or in combination with one or more of the first through fourth implementations, the plurality of die exposure fields include a first die exposure field in a first row on the semiconductor substrate and a second die exposure field in a second row on the semiconductor substrate, the subset of the one or more non-exposure fields includes a non-exposure field adjacent to the first die exposure field in the first row, and generating the exposure recipe includes generating the exposure recipe to cause the exposure tool to skip exposure of the non-exposure field adjacent to the first die exposure field, and generating the scanner route to cause the substrate stage to proceed directly from the first die exposure field to the second die exposure field.

In a sixth implementation, alone or in combination with one or more of the first through fifth implementations, the input to the substrate stage causes the substrate stage to proceed from the first row to the second row without performing scan up or scan down routing operations for the non-exposure field adjacent to the first die exposure field. In a seventh implementation, alone or in combination with one or more of the first through sixth implementations, the first exposure field map includes a line layer exposure field map, and the second exposure field map includes a hole layer exposure field map.

Although FIG. 8 shows example blocks of process 800, in some implementations, process 800 may include additional blocks, fewer blocks, different blocks, or differently arranged blocks than those depicted in FIG. 8. Additionally, or alternatively, two or more of the blocks of process 800 may be performed in parallel.

In this way, a scanner control system generates a scanner route for an exposure recipe such that the distance traveled by a substrate stage of an exposure tool along the scanner route is reduced and/or optimized for non-exposure fields on a semiconductor substrate. In this way, the scanner control system increases the productivity of the exposure tool, reduces processing times of the exposure tool, and increases yield in a semiconductor fabrication facility in which the exposure tool is included.

As described in greater detail above, some implementations described herein provide a method. The method includes generating, by a scanner control system, an exposure recipe for performing an exposure operation for a semiconductor substrate, where the exposure recipe includes information identifying: a plurality of die exposure fields, on the semiconductor substrate, that are to be exposed in the exposure operation, one or more non-exposure fields, on the semiconductor substrate, for which exposure is to be skipped in the exposure operation, and a scanner route for traversing between the plurality of die exposure fields, where the one or more non-exposure fields are omitted from the scanner route. The method includes providing, by the scanner control system, an input to a substrate stage of an exposure tool to cause the substrate stage to step the semiconductor substrate along the scanner route in the exposure operation.

As described in greater detail above, some implementations described herein provide a method. The method includes generating, by a scanner control system, a first exposure field map including a plurality of die exposure fields and one or more non-die exposure fields. The method includes generating, by the scanner control system, a second exposure field map including the plurality of die exposure fields and one or more non-exposure fields. The method includes generating, by the scanner control system and based on the first exposure field map and the second exposure field map, an exposure recipe that identifies, the plurality of die exposure fields, a subset of the one or more non-die exposure fields, a subset of the one or more non-exposure fields, and a scanner route for traversing between the plurality of die exposure fields, the subset of the one or more non-die exposure fields, and the subset of the one or more non-exposure fields. The method includes providing, by the scanner control system, an input to a substrate stage of an exposure tool to cause the substrate stage to skip the subset of the one or more non-exposure fields in an exposure operation of a semiconductor substrate.

As described in greater detail above, some implementations described herein provide a scanner control system. The scanner control system includes a layer generator configured, generate a line layer exposure map for a semiconductor substrate, and generate a hole layer exposure map for the semiconductor substrate. The scanner control system includes a recipe generator configured to generate an exposure recipe based on the line layer exposure map and the hole layer exposure map, where a scanner route for an exposure operation of the semiconductor substrate is optimized to reduce a distance traveled by a substrate stage of an exposure tool in the exposure operation. The scanner control system includes a scanner controller configured to communicate with the substrate stage of the exposure tool to control operation of the substrate stage based on the scanner route.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   generating, by a processor, a first scanner route for traversing over or across a plurality of fields, comprising one or more die exposure fields and one or more non-die exposure fields, on a substrate;
   generating, by the processor and based on the first scanner route, a first exposure field map comprising the one or more die exposure fields and one or more non-exposure fields, of the substrate, that replace the one or more non-die exposure fields;

generating, by the processor and based on the first exposure field map, an exposure recipe including information identifying a second scanner route for traversing over or across a subset of the plurality of fields; and causing, by the processor, a substrate stage of an exposure tool to move according to the exposure recipe.

2. The method of claim 1, wherein the one or more die exposure fields are associated with a scan-up scan-down (SUSD) configuration.

3. The method of claim 2, wherein the second scanner route is for traversing over or across the one or more non-exposure fields independent from the SUSD configuration.

4. The method of claim 1, wherein the one or more non-exposure fields comprises a first non-exposure field and a second non-exposure field, wherein the second scanner route includes the first non-exposure field and avoids the second non-exposure field.

5. The method of claim 1, wherein the first scanner route is associated with a second exposure field map comprising the one or more die exposure fields and the one or more non-die exposure fields.

6. A method, comprising:
generating, by a processor, a first exposure field map comprising a plurality of fields, of a semiconductor substrate, including a plurality of die exposure fields and a plurality of non-die exposure fields;

generating, by the processor and based on the first exposure field map, a second exposure field map including the plurality of die exposure fields and a plurality of non-exposure fields that replace the plurality of non-die exposure fields;

generating, by the processor and based on the first exposure field map and the second exposure field map, an exposure recipe that identifies a first scanner route for traversing across a subset of the plurality of fields; and causing, by the processor, an exposure tool to move according to the exposure recipe.

7. The method of claim 6, wherein the plurality of non-exposure fields are located at an edge of the semiconductor substrate.

8. The method of claim 6, wherein causing the exposure tool to move comprises:
causing the exposure tool to move directly from a starting point through one or more of the plurality of non-exposure fields, and to a first die exposure field of the plurality of die exposure fields.

9. The method of claim 8, wherein causing the exposure tool to move comprises:
causing the exposure tool to move directly from the starting point, through the plurality of non-exposure fields in an approximate straight line, and to the first die exposure field.

10. The method of claim 8, wherein the first die exposure field is associated with a scan up or scan down routing operation.

11. The method of claim 8, wherein the first die exposure field is to be exposed in an exposure operation of the exposure tool, and wherein the one or more of the plurality of non-exposure fields are to be skipped in the exposure operation.

12. The method of claim 6, wherein the first exposure field map is a line layer map, and the second exposure field map is a hole layer map.

13. The method of claim 6, further comprising:
generating a second scanner route for the first exposure field map; and
generating a third scanner route for the second exposure field map,
wherein the second scanner route includes, and the third scanning route avoids, a particular non-exposure field of the plurality of non-exposure fields.

14. A scanner control system, comprising:
one or more memories,
one or more processors, coupled to the one or more memories, configured to:
generate a first scanner route for traversing over or across a plurality of fields, comprising one or more die exposure fields and one or more non-die exposure fields, on a substrate;
generate, by the processor and based on the first scanner route, a first exposure field map comprising the one or more die exposure fields and one or more non-exposure fields, of the substrate, that replace the one or more non-die exposure fields;
generate, based on the first exposure field map, an exposure recipe including information identifying a second scanner route for traversing over or across a subset of the plurality of fields; and
cause a substrate stage of an exposure tool to move according to the exposure recipe.

15. The scanner control system of claim 14, wherein the first exposure field map is a hole layer map.

16. The scanner control system of claim 15, wherein the one or more processors are configured to:
generate a line layer map comprising the plurality of fields,
wherein the first scanner route is generated based on the line layer map.

17. The scanner control system of claim 14, wherein the one or more die exposure fields are associated with a scan-up scan-down (SUSD) configuration.

18. The scanner control system of claim 17, wherein the second scanner route is for traversing over or across the one or more non-exposure fields independent from the SUSD configuration.

19. The scanner control system of claim 14, wherein the one or more non-exposure fields comprises a first non-exposure field and a second non-exposure field, and wherein the second scanner route includes the first non-exposure field and avoids the second non-exposure field.

20. The scanner control system of claim 14, wherein the first scanner route is associated with a second exposure field map comprising the one or more die exposure fields and the one or more non-die exposure fields.

* * * * *